United States Patent
Lal et al.

(10) Patent No.: US 9,159,710 B2
(45) Date of Patent: Oct. 13, 2015

(54) STRUCTURES AND METHODS FOR ELECTRICALLY AND MECHANICALLY LINKED MONOLITHICALLY INTEGRATED TRANSISTOR AND NEMS/MEMS DEVICE

(75) Inventors: Amit Lal, Ithaca, NY (US); Kwame Amponsah, Ithaca, NY (US)

(73) Assignee: CORNELL UNIVERSITY, Ithaca, NY (US)

( * ) Notice: Subject to any disclaimer, the term of this patent is extended or adjusted under 35 U.S.C. 154(b) by 0 days.

(21) Appl. No.: 13/990,830

(22) PCT Filed: Dec. 1, 2011

(86) PCT No.: PCT/US2011/062871
§ 371 (c)(1),
(2), (4) Date: Aug. 26, 2013

(87) PCT Pub. No.: WO2012/075272
PCT Pub. Date: Jun. 7, 2012

(65) Prior Publication Data
US 2013/0328109 A1  Dec. 12, 2013

Related U.S. Application Data

(60) Provisional application No. 61/418,467, filed on Dec. 1, 2010.

(51) Int. Cl.
*H01L 27/20*  (2006.01)
*H01L 29/84*  (2006.01)
(Continued)

(52) U.S. Cl.
CPC ............ *H01L 25/16* (2013.01); *B81C 1/00246* (2013.01); *H01L 29/42316* (2013.01);
(Continued)

(58) Field of Classification Search
CPC .......... H01L 27/20; H01L 29/84; H01L 29/00
USPC .............. 257/52, 254, 256; 438/196, 231, 232
See application file for complete search history.

(56) References Cited

U.S. PATENT DOCUMENTS 5,880,921 A  3/1999 Tham et al.
6,531,331 B1  3/2003 Bennett et al.
(Continued)

OTHER PUBLICATIONS

Grogg, D.; Tsamados, D.; Badila, N.D.; Ionescu, A.M.; , "Integration of MOSFET Transistors in MEMS Resonators for Improved Output Detection," Solid-State Sensors, Actuators and Microsystems Conference, 2007. Transducers 2007. International , vol., no., pp. 1709-1712, Jun. 10-14, 2007 doi: 10.1109/SENSOR.2007.4300481 URL: http://ieeexplore.ieee.org/stamp/stamp.jsp?tp=&arnumber=4300481&isnumber=4300056.
(Continued)

*Primary Examiner* — Phuc Dang
(74) *Attorney, Agent, or Firm* — William Greener; Alek P. Szecsy; Bond, Schoeneck & King, PLLC

(57) ABSTRACT

A device including a NEMS/MEMS machine(s) and associated electrical circuitry. The circuitry includes at least one transistor, preferably JFET, that is used to: (i) actuate the NEMS/MEMS machine; and/or (ii) receive feedback from the operation of the NEMS/MEMS machine. The transistor (e.g., the JFET) and the NEMS/MEMS machine are monolithically integrated for enhanced signal transduction and signal processing. Monolithic integration is preferred to hybrid integration (e.g., integration using wire bonds, flip chip contact bonds or the like) due to reduce parasitics and mismatches. In one embodiment, the JFET is integrated directly into a MEMS machine, that is in the form of a SOI MEMS cantilever, to form an extra-tight integration between sensing and electronic integration. When a cantilever connected to the JFET is electrostatically actuated, its motion directly affects the current in the JFET through monolithically integrated conduction paths (e.g., traces, vias, etc.). In one embodiment, devices according to the present invention were realized in 2 µm thick SOI cross-wire beams, with a MoSi2 contact metallization for stress minimization and ohmic contact. In this embodiment, the pull-in voltage for the MEMS cantilever was 21V and the pinch-off voltage of the JFET was −19V.

26 Claims, 17 Drawing Sheets

(51) Int. Cl.
  *H01L 25/16* (2006.01)
  *B81C 1/00* (2006.01)
  *H01L 29/423* (2006.01)
  *H01L 29/66* (2006.01)
  *H01L 29/735* (2006.01)
  *H01L 29/808* (2006.01)
  *H01L 29/812* (2006.01)

(52) U.S. Cl.
  CPC .... *H01L29/66893* (2013.01); *H01L 29/66901* (2013.01); *H01L 29/735* (2013.01); *H01L 29/8086* (2013.01); *H01L 29/8126* (2013.01); *B81C 2203/075* (2013.01); *H01L 2924/0002* (2013.01)

(56) References Cited

U.S. PATENT DOCUMENTS

| | | | |
|---|---|---|---|
| 6,797,534 B1 | 9/2004 | Tu et al. | |
| 7,205,173 B2 | 4/2007 | Brunson et al. | |
| 7,615,788 B2 | 11/2009 | Kornegay et al. | |
| 7,759,924 B2 | 7/2010 | Shekhawat | |
| 7,868,403 B1 | 1/2011 | Ivanov et al. | |
| 7,989,889 B1 | 8/2011 | Kerr et al. | |
| 8,012,785 B2 | 9/2011 | Liang et al. | |
| 8,440,523 B1 * | 5/2013 | Guillorn et al. | 438/243 |
| 8,580,597 B2 * | 11/2013 | Ollier et al. | 438/50 |
| 2005/0139871 A1 * | 6/2005 | Brunson et al. | 257/287 |
| 2007/0194225 A1 * | 8/2007 | Zorn | 250/306 |
| 2010/0149625 A1 * | 6/2010 | Lu et al. | 359/291 |
| 2010/0171569 A1 | 7/2010 | Ionescu et al. | |
| 2010/0244855 A1 * | 9/2010 | Agache et al. | 324/634 |
| 2010/0263997 A1 | 10/2010 | Hilgers | |
| 2010/0314668 A1 | 12/2010 | Ollier et al. | |
| 2011/0026742 A1 | 2/2011 | Huang et al. | |
| 2011/0057288 A1 | 3/2011 | Tan et al. | |
| 2011/0068374 A1 | 3/2011 | Tan et al. | |
| 2011/0101475 A1 | 5/2011 | Parpia et al. | |
| 2011/0163440 A1 * | 7/2011 | Theuss | 257/737 |
| 2011/0235228 A1 * | 9/2011 | Salcedo et al. | 361/111 |

OTHER PUBLICATIONS

Oilier, E.; Duraffourg, L.; Colinet, E.; Durand, C.; Renaud, D.; Royet, A.; Renaux, P.; Casset, F.; Robert, P.; , "Lateral MOSFET transistor with movable gate for NEMS devices compatible with "In-IC" integration," Nano/Micro Engineered and Molecular Systems, 2008. NEMS 2008. 3rd IEEE International Conference on , vol., no., pp. 764-769, Jan. 6-9, 2008 doi: 10.1109/NEMS.2008.4484439 URL: http://ieeexplore.ieee.org/stamp/stamp.jsp?tp=&arnumber=4484439&isnumber=4484266.

* cited by examiner

STRUCTURES AND METHODS FOR ELECTRICALLY AND MECHANICALLY LINKED MONOLITHICALLY INTEGRATED TRANSISTOR AND NEMS/MEMS DEVICE

RELATED APPLICATION

The present application claims priority to U.S. provisional patent application No. 61/418,467, filed on 1 Dec. 2010; all of the foregoing patent-related document(s) are hereby incorporated by reference herein in their respective entirety(ies).

FEDERALLY SPONSORED RESEARCH OR DEVELOPMENT

The U.S. Government may have certain rights in this invention pursuant to Grant No. DMR 0520404 awarded by NSF.

BACKGROUND OF THE INVENTION

1. Field of the Invention

The present invention relates to JFETs, and especially JFETS designed to be suitable for use in helping to control NEMS/MEMS scale machines (herein called "NEMS/MEMS machines," see also, "NEMS/MEMS scale" in the DEFINITIONS section). The present invention further relates to devices which include both the NEMS/MEMS machine and at least some of the circuitry for controlling the operation of the NEMS/MEMS machine (see definition section). These combinations of the NEMS/MEMS machine hardware set and at least a portion of its control circuitry (e.g. a JFET) will sometimes herein be referred to as "NEMS/MEMS devices."

2. Description of the Related Art

As shown in FIG. 1, conventional SOI-NEMS/MEMS device (see definition of SOI in the DEFINITIONS section) 100, includes: An electronics chip consisting mostly of complementary metal oxide ("CMOS") semiconductor transistors, but active electronic transistors in general, 102; bonded conduction path 112; and NEMS/MEMS chip 113. Electronics chip 102 includes: contact pad/s 104, 110; demodulator/filter/pre-amp/reference module 106; and amplifier 108. NEMS/MEMS chip 113 includes: mechanical springs and masses 114; fingers often used for electrostatic actuation 116; anchor 118; proof mass 119; and contact pads 120. Sub-assembly 114 (including proof mass 119) moves in the directions indicated by arrows D1 and D2: (i) to create an electrical signal; and/or (ii) in response to an electrical signal. This sort of conventional NEMS/MEMS device is part of many commercial products and/or proposed products, such as accelerometers, gyroscopes, electrical switches, resonators, timing devices, optical switches, optical gratings, and microfluidic devices. Many commercial NEMS/MEMS devices are made with thicker suspended parts to obtain higher mass and greater sense capacitances. This has been obtained through using SOI wafers and etching them using DRIE processing techniques. Even without SOI substrates, using processes such as SCREAM, high aspect ratio NEMS/MEMS devices are commercially available.

There are two main architectures for electrically connecting the NEMS/MEMS machine and its associated transistors (e.g., field effect transistors, or "FETs," for sensing a motion characteristic (see DEFINITIONS section)). These two main architectures, for electrically connecting transistor and machine are as follows: (i) putting the machine and the transistors respectively on two different chip substrates and electrically connecting them by conduction paths that have "conductor bonding" (see DEFINITIONS section); and (ii) putting the machine and transistor on a common chip substrate so that the machine and transistor are electrically connected to each other using only non-bonded conduction path(s). Architecture (i) will sometimes be referred to herein as the "hybrid technique" (or "hybrid architecture"). Architecture (ii) will sometimes be herein referred to as "monolithic integration." The hybrid technique, where the integrated circuit and NEMS and/or MEMS machine components are fabricated independently and typically wire bonded or flip-chip bonded together, is shown in FIG. 1.

Most commercial MEMS sensor solutions use the hybrid integration process for electrical interface and signal conditioning. The hybrid-technique is often justified as a way to reduce complexity of CMOS integration with NEMS/MEMS. Monolithic integration with a highly complex electronics technology such as multi-level interconnect state-of-art CMOS can be expensive for monolithic integration. This is because, the NEMS/MEMS components often take much larger amount of real-estate on chip compared to the transistors needed for the sensor signal conditioning. Hence, buying a separate few-transistor signal conditioning chip, and bonding to a separate low-complexity NEMS/MEMS chip is often cost-effective. Although the hybrid technique offers the advantage of independent optimization of the integrated circuit and NEMS fabrication process flows, it is conventionally recognized that the cost for assembly and packaging can be higher than the cost of monolithic integration. Previously, various research groups have monolithically integrated MOSFETs into NEMS/MEMS devices for signal transduction. The focus generally has been on monolithic integration with CMOS transistors, assuming that one could integrate the NEMS/MEMS process with conventional state-of-art ultra-miniature CMOS technology. Since the number of transistors needed to obtain effective signal conditioning, co-integration of transistors within the NEMS/MEMS fabrication flow could enable an optimal cost/performance of NEMS/MEMS. Recent work has focused on integrating the MOS structures within NEMS/MEMS, partly owing to the fact that the DC power consumption in MOS transistors can be low due to high $I_{on}/I_{off}$ ratio of devices and very low gate leakage currents. However, MOS devices suffer from higher input referred noise due to the noisy conduction of carriers along the oxide-silicon interface. It has been widely recognized that the flicker noise for MOS transistors is inferior to that of JFET or Junction Field Effect Transistors, also known as Junction Gate Field Effect Transistors.

A NEMS/MEMS device, including a NEMS/MEMS machine and an associated transistor in the form of a JFET, is disclosed in U.S. Pat. No. 7,205,173 ("Brunson"). In Brunson, the JFET portions of the NEMS/MEMS device are in the form of "wells," which is to say that the doping that creates the constituent regions of the Brunson JFET is accomplished by diffusing dopants into the wafer thickness (that is, in a direction substantially normal to the major surface of the semiconductor layer through which the diffusion occurs. In 173 Brunson, the doped wells forming the Brunson JFET do not extend all the way across the thickness of their semiconductor layer (that is, the wells do not extend from one major surface of the semiconductor, all the way to the opposite major surface. Because of the geometry of the well structures in Brunson, the channel conductance is squeezed (and sometimes pinched off) by depleted zone(s) that expand in the thickness direction of the semiconductor layer to control conduction. In Brunson, NEMS/MEMS were integrated with the JFET transistors monolithically, but the link between transistors and the NEMS/MEMS was purely electrical. The output of the NEMS/MEMS, being capacitive output, was linked to the transistor gates.

The following published documents may also include helpful background information: (i) Oilier, E., Duraffourg, L., Colinet, E., Durand, C., Renaud, D., Royet, A., Renaux, P., Casset, F., Robert, P., "Lateral MOSFET Transistor With Movable Gate for NEMS Devices Compatible With "In-IC" Integration," Nano/Micro Engineered and Molecular Systems, 2008, NEMS 2008, 3rd IEEE International Conference on, vol., no., pp. 764-769, 6-9 Jan. 2008, http://ieeexplore.ieee.org/stamp/stamp.jsp?tp=arnumber=4484439&isnumber=4484266; (ii) U.S. Pat. No. 6,531,331 ("Bennett"); (iii) U.S. Pat. No. 7,615,788 ("Kornegay"); (iv) U.S. Pat. No. 8,012,785 ("Liang"); (v) U.S. Pat. No. 7,989,889 ("Kerr"); (vi) US Patent Publication No. 2011/0101475 ("Parpia"); (vii) US Patent Publication No. 2010/0263997 ("Hilgers"); (viii) US Patent Publication No. 2011/0068374 ("Tan"); (ix) U.S. Pat. No. 7,759,924 (Shekhawat); (x) U.S. Pat. No. 7,868,403 ("Ivanov"); (xi) U.S. Pat. No. 6,797,534 ("Tu"); (xii) US Patent Publication No. 2010/0171569 ("Ionescu"); (xiii) US Patent Publication No. 2010/0314668 ("Ollier"); (xiv) US Patent Publication No. 2011/0026742 ("Huang"); (xv) US Patent Publication No. 2011/0057288 ("Tan"); (xvi) U.S. Pat. No. 5,880,921 ("Tham"); and (xii) Grogg, D., Tsamados, D., Badila, N. D., Ionescu, A. M., "Integration of MOSFET Transistors in MEMS Resonators for Improved Output Detection," Solid-State Sensors, Actuators and Microsystems Conference, 2007, TRANSDUCERS 2007, International. vol., no., pp. 1709-1712, 10-14 June 2007, http://ieeexplore.ieee.org/stamp/stamp.jsp?tp=&arnumber=4300481&isnumber=430005 (xviii) US Patent No. US 2011/0024812 A1 ("Weinstein et al"); (xix) US Patent No. US 2008/0001658 A1 ("Mojarradi et al"); (xx) US Patent No. US 2007/0008013 A1 ("Fijany et al"); (xxi) Akarvardar et al. (US application 2007-0008013 A1).

Description of the Related Art Section Disclaimer: To the extent that specific publications are discussed above in this Description of the Related Art Section, these discussions should not be taken as an admission that the discussed publications (for example, published patents) are prior art for patent law purposes. For example, some or all of the discussed publications may not be sufficiently early in time, may not reflect subject matter developed early enough in time and/or may not be sufficiently enabling so as to amount to prior art for patent law purposes. To the extent that specific publications are discussed above in this Description of the Related Art Section, they are all hereby incorporated by reference into this document in their respective entirety(ies).

BRIEF SUMMARY OF THE INVENTION

The present invention recognizes that in hybrid architecture device 100, the wire bond introduces parasitic phenomena as well as mismatch phenomena. The present invention further recognizes that monolithic integration of NEMS/MEMS machines, with FETs, results in the minimization of the wire-bond parasitic phenomena, and that this minimization of parasitics can be highly advantageous. More specifically, the hybrid solution introduces parasitics and mismatches during the assembly and packaging of the FETS and NEMS components due to the wire bonds that connects the two dice and this prevents SOI-NEMS/MEMS to fully realize optimal performance.

One aspect of the present invention is directed to a JFET structure (and associated methods of making and/or using) that is contained and insulated within a single semiconductor layer in a monolithically integrated chip stack. Another aspect of the present invention is a NEMS/MEMS device (and associated methods of making and/or using) that includes a NEMS/MEMS machine and a JFET structure that is contained and insulated within a single semiconductor layer in a monolithically integrated chip stack. In at least some JFETs according to the present invention.

According to another aspect of the present invention, NEMS/MEMS devices are being constructed from high aspect ratio DRIE etched silicon, and the lateral beam thicknesses can be small, the JFET transistors can be integrated within beam structures used in NEMS/MEMS. Direct integration within the springs and masses used would lead to optimal use of chip-real-estate, and minimize interconnects to sensing elements. Using the thin lateral dimensions, one can diffuse dopants into high aspect ratio beams laterally; and do define channel conduction to extend across the entire thickness of a silicon layer (bounded on at least its lower side by an insulative layer (e.g., a silicon dioxide layer). This is to be sharply distinguished from Brunson, where the well structures defining the channel only extend part way across the thickness of their semiconductor layer medium. By using a JFET without wells, and instead with doped regions that span the entire thickness of the semiconductor layer. the JFET becomes easier to make and/or has improved performance especially when tightly electrically integrated on a single chip with a NEMS/MEMS machine. After the JFETS are formed by doping, the beams which are part of the NEMS/MEMS can, in some embodiments of the present invention, be released for tightly integrated transistor and NEMS/MEMS such that the transistors are directly part of the NEMS/MEMS.

Given that many NEMS/MEMS devices are being constructed from high aspect ratio DRIE etched silicon, and the lateral beam thicknesses can be small, according to another aspect of the present invention, the JFET transistor(s) can be integrated within the material of the cantilever beam structures (and/or otter moving parts) used in NEMS/MEMS. Direct integration within the springs and masses used would lead to optimal use of chip-real-estate, and minimize interconnects to sensing elements. Using the thin lateral dimensions, one can diffuse dopants into high aspect ratio beams laterally; do define channel conduction along the wafer, instead of vertically into the wafer as in traditional JFETs. After the transistors are integrated, the beams which are part of the NEMS/MEMS can be released for tightly integrated transistor and NEMS/MEMS such that the transistors are directly part of the NEMS/MEMS.

According to an aspect of the present invention, a device includes: (a) a first insulator layer that defines: (i) the major plane of the device; and (ii) a transverse direction that is normal to the major plane at any given point on the major plane; and (b) a first semiconductor layer. The first semiconductor layer and the first insulator layer are monolithically integrated into a stack structure. The stack structure includes a first NEMS/MEMS region. The first NEMS/MEMS region of the stack structure is structured, connected, sized, shaped and/or located to operate as a first NEMS/MEMS machine that includes a first moving part. The semiconductor layer includes a first major surface and a second major surface, spaced apart in the transverse direction. The first semiconductor layer includes a first JFET structure. The first JFET structure includes: the following JFET regions: a source region, a drain region, a first gate region and a conductance channel region. The following JFET regions of the first JFET extend entirely across a transverse dimension of the first semiconductor layer. x is a first doping type (either p or n). y is a second doping type (either p or n). The conductance channel region of the first JFET structure is x doped and the first gate is y doped, to an extent so that during operation of the device: (i) the conductance channel of the first JFET structure will develop depleted and undepleted portions, and (ii) the depleted portions will, at times and as determined by operating conditions, pinch off the conductance channel of the first JFET structure. The first JFET is electrically connected to the first NEMS/MEMS machine. The insulator layer is electrically insulating so that current does not flow in the insulative layer during operation of the device.

According to another aspect of the present invention, a method of making a JFET structure is presented. The JFET structure includes a first insulator layer and a first semiconductor layer. The method includes the following steps: monolithically forming the first semiconductor layer and the first insulator layer into a stack structure so that the first semiconductor layer includes the JFET structure such that the JFET structure is electrically isolated from other layers of the stack structure; x doping the first semiconductor layer, across its entire transverse direction, to form in the first semiconductor layer a source region; x doping the first semiconductor layer, across its entire transverse direction, to form in the first semiconductor layer a drain region; lightly x doping the first semiconductor layer, across its entire transverse direction, to form in the first semiconductor layer a conductance channel; and y doping the first semiconductor layer, across its entire transverse direction, to form in the first semiconductor layer a first gate region. x is a first doping type (either p or n). y is a second doping type (either p or n). The doping steps create the JFET structure within the first semiconductor layer. The JFET structure is structured, located and/or connected so that during operation of the JFET structure: (i) the conductance channel of the first JFET structure will develop depleted and undepleted portions, and (ii) the depleted portions will, at times and as determined by operating conditions, expand to pinch off the conductance channel.

BRIEF DESCRIPTION OF THE DRAWINGS

The present invention will be more fully understood and appreciated by reading the following Detailed Description in conjunction with the accompanying drawings, in which:

FIG. 29 is a method of fabricating showing eleven intermediate stack structures that exist during the manufacturing process.

DETAILED DESCRIPTION OF THE INVENTION

Figure 1:
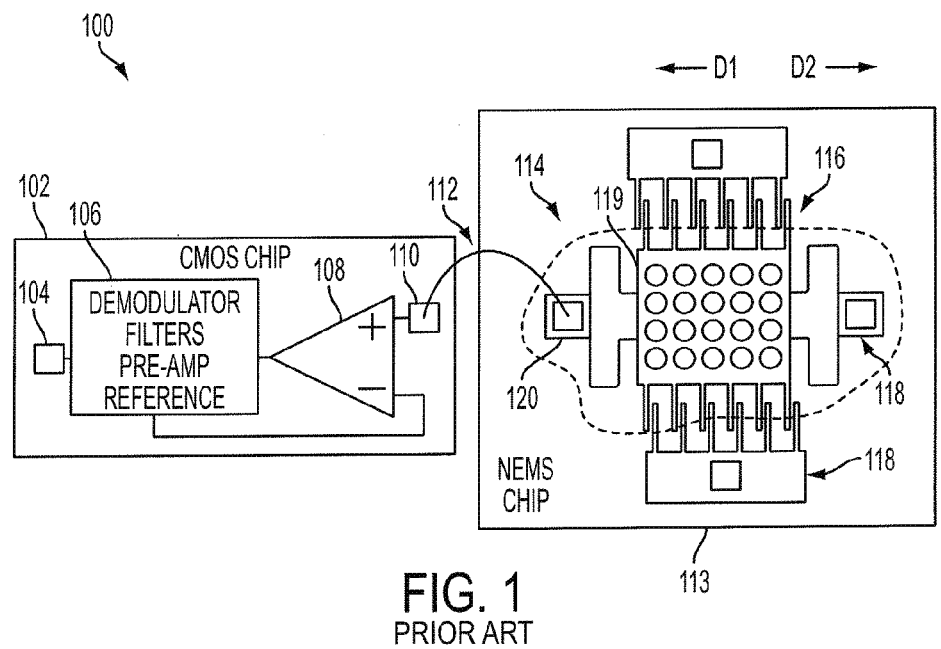
FIG. 1 is a schematic view of a prior art NEMS/MEMS device.
Figure 2:
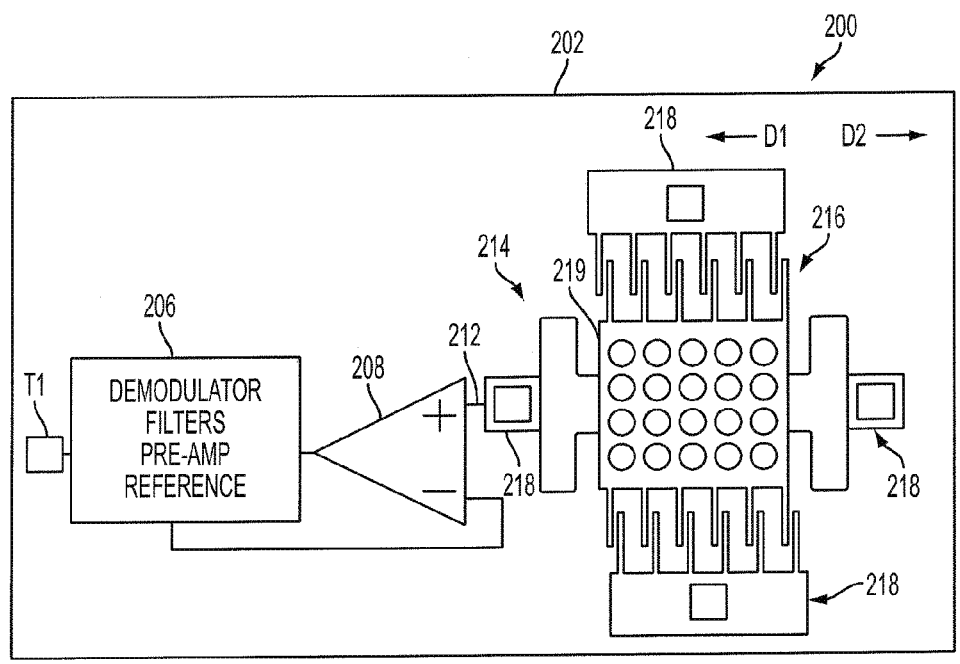
FIG. 2 is a schematic view of a first embodiment of a NEMS/MEMS device according to the present invention.

FIG. 2 shows a NEMS/MEMS device 200, which is substantially constituted by a single, monolithically integrated chip 202. In some embodiments, the NEMS/MEMS device may include additional control electronics, such as a processing network, located on a second chip substrate. However, in device 200, the NEMS/MEMS machine and at least one of its associated transistors are located on the single chip 202. As shown in FIG. 2, chip 202 includes: first terminal T1; demodulator/filters/pre-amp/reference module 206; amplifier 208; non-bonded path 212; anchor structures 218; spring/mass sub-assembly 214; proof mass 219; and finger structure 216.

Figure 3A:
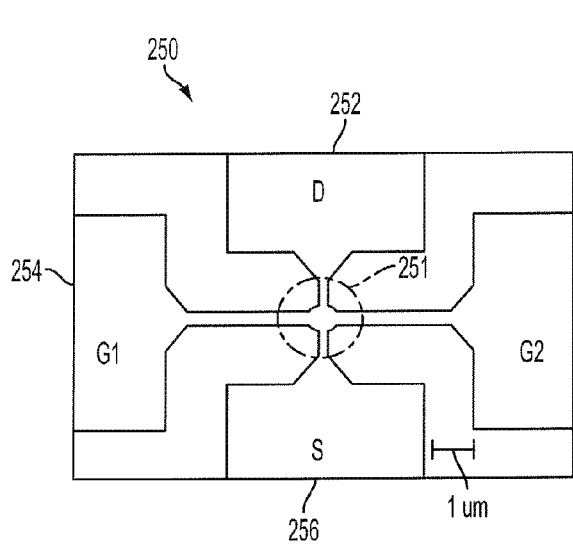
FIG. 3A a plan view of a first embodiment of a JFET according to the present invention.
Figures 1, 3B:
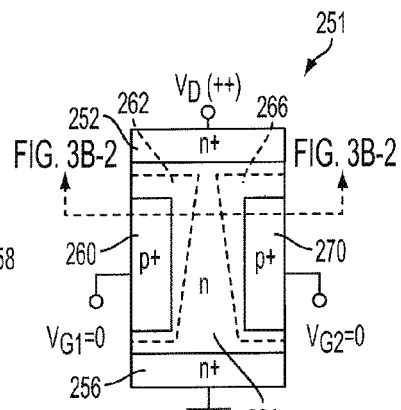
FIG. 3B a plan and cross-sectional view of the first embodiment JFET operating at its "knee voltage;"
Figures 2, 3B:
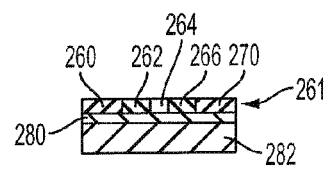
Figures 1, 3C:
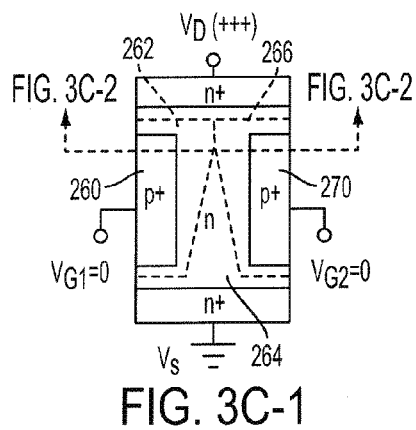
FIG. 3C a plan and cross-sectional view of the first embodiment JFET operating above its "knee voltage;"
Figures 2, 3C:
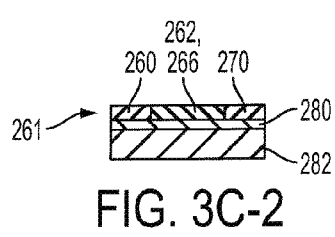
Figure 3D:
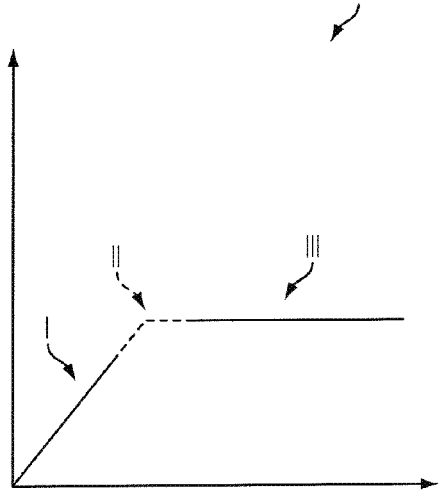
FIG. 3D is a graph showing certain characteristics of the performance of the first embodiment JFET.

The mode of operation for NEMS/MEMS devices according to the present invention will now be discussed with reference to FIGS. 3A to 3D. As shown in FIG. 3A, JFET 250 includes: drain region 252; first gate region 254; source region 256; second gate region 258 and channel region 251. As shown in FIGS. 3B and 3C, channel region 251 connects source 256 to drain 252. As further shown in FIGS. 3B and 3C, channel region 251 includes: first semiconductor layer 261; insulator layer 280 (made of, e.g., silicon dioxide); and second semiconductor layer 282 (made of, e.g., silicon). As further shown in FIGS. 3B and 3C, first semiconductor layer 261 includes: first p doped sub-region 260; second p doped sub-region 270; first carrier-depleted channel portion 262 of lightly n doped region 262, 264, 266; second carrier-depleted channel portion 266 of lightly n doped region 262, 264, 266; and carrier-undepleted channel portion 264 of lightly n doped region 262, 264, 266. The channel sub-region in layer 261 therefore includes depleted portions 262 and 266, as well as undepleted portion 264. This channel sub-region 262, 264, 266 is lightly n doped. As can be seen by comparing FIG. 3B and FIG. 3C, the width of the carrier depleted zone increases in footprint when the electrical potential between the drain and source increases. As shown in FIG. 3C, at some point the carrier depleted portions 262, 266 will swell to the extent that they "pinch off" the undepleted portion such that the undepleted portion no longer extends continuously from the drain to the source. As shown in graph 299 of FIG. 3D, once this phenomenon of pinch off occurs, then further increases in the magnitude of the electrical potential between the source and drain will not result in an increase of current flow through the channel sub-region 262, 264, 266.

An n-channel JFET is a majority carrier transistor where: (i) electrons flow from the source toward the drain; and (ii) holes flow from the drain toward the source. FIGS. 3B and 3C each show the top view and the transverse cross-section of a channel region in 4-terminal n-channel JFET 250, with 3B and 3C respectively showing the JFET in: (i) an unsaturated state (although getting close to saturation); and (ii) a saturated state. A comparison of FIGS. 3B and 3C show the gradual increase in the width of depleted portions 262 and 266 as $V_{DS}$ is increased. The source, gate-1 and gate-2 are tied to ground. With a small $V_{DS}$ applied, the channel acts like an ohmic resistor (see region I of FIG. 3D) and current flows from the drain to the source. As $V_{DS}$ increases, the reverse bias on the pn-junction between the drain and the gate is further reverse biased. Because of this reverse bias, depleted portions 262, 266 form between the gates (more precisely, the p doped sub-regions in the channel region) and the undepleted portion of lightly n doped sub-region 262, 264, 266 when $V_{DS}$ is present.

The widening of the gate-to-channel depletion region into the channel area causes the resistance of the channel to increase as represented in FIG. 3B and region II of graph 299. As $V_{DS}$ further increases, the depletion regions form around both gates meet at the drain and the channel is "pinched-off." The drain current saturates and any further increase in the drain voltage does not introduce considerable change in the drain current. To summarize the foregoing, as a larger $V_{DS}$ is applied, the gate-channel depletion region gets wider and pushes into the channel as a result increasing the channel resistance. Pinch-off is reached when the area around the drain is fully depleted and further increase in $V_{DS}$ has insignificant change in the drain current and the drain current saturates. Graph 299 shows current-versus-voltage characteristics for zero gate voltage. At pinch-off, the electric field that exists between the source and the drain causes electrons to drift from the source to the drain. FIG. 3C and Region III on graph 299 demonstrates the saturation phenomenon.

Ten equations will now be set forth, followed by a discussion of the equations.

$$I_D(sat) = I_{DSS}\left(1 - \left(\frac{V_{GS}}{V_P}\right)\right)^2 \quad (1)$$

$$F_1 = \frac{1}{2}\frac{\varepsilon_0 A}{(d-x)^2}(V_{G3} - V_{G2})^2 \quad (2)$$

$$F_2 = -\frac{1}{2}\frac{\varepsilon_0 A}{(d+x)^2}(V_{G2})^2 \quad (3)$$

Where $\varepsilon_0$ is the permittivity of vacuum, A=8e-8 cm² is the actuator area, d=450 nm is the initial gap, and x is the beam displacement. Using Taylor series approximation, $$F_3 = F_1 + F_2$$

$$F_3 = \frac{1}{2}\frac{\varepsilon_0 A}{(d)^2}\left[(V_{G3} - V_{G2})^2\left(1 + 2\frac{x}{d}\right) + (V_{G2})^2\left(-1 + 2\frac{x}{d}\right)\right] \quad (4)$$

$$F + F_3 = kx \quad F = m \cdot g \quad (5)$$

$$x = \frac{F + F_3}{k} \quad (6)$$

$$V_{G2} = \left(\frac{C_{nems1}}{C_{nems1} + C_{dep} // C_{nems2}}\right)V_{G3} \quad (7)$$

where $C_{nems1}$ is the capacitance between the gate-3 and cantilever, $C_{nems2}$ is the capacitance between the cantilever and gate-4 and $C_{dep}$ is the depletion capacitance at the cantilever-JFET junction. $C_{nems1}$ and $C_{nems2}$ are derived as $$C_{nems1} = \frac{\varepsilon_0 A}{d-x} = C_0\left(1 + \frac{x}{d}\right) \quad (8)$$

$$C_{nems2} = \frac{\varepsilon_0 A}{d+x} = C_0\left(1 - \frac{x}{d}\right) \quad (9)$$

$$C_{dep} = \left(\sqrt{\frac{q\varepsilon_{si}N_d}{2(V_{bi} - V_{G2})}}\right)A \quad (10)$$

Where $C_0$ the nominal capacitance, q is the electron charge, $\varepsilon_{si}$ is the permittivity of silicon, $N_d$=4.16e14 ions/cm³ is the doping concentration in the channel assuming a one-sided junction and $V_{bi}$=0.81 V is the built-in potential. $V_{G2}$ can be determined numerically by substituting Eq. 8, 9 and 10 into Eq. 7.

Figure 4:
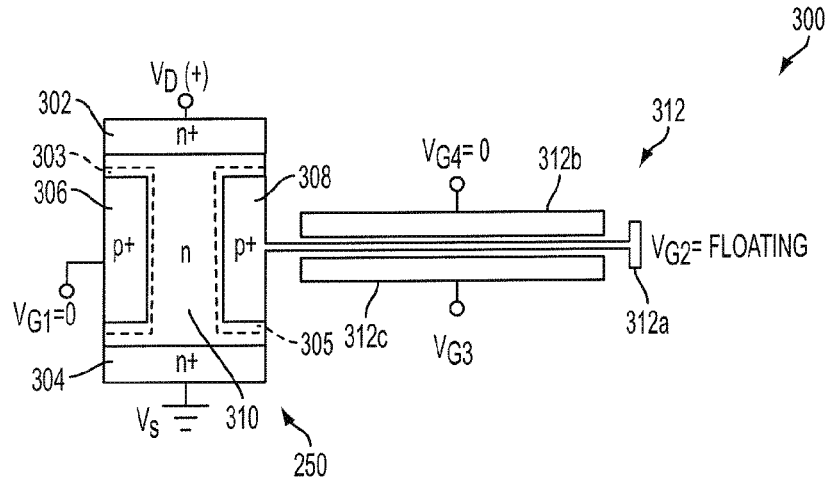
FIG. 4 is schematic view of a second embodiment of a NEMS/MEMS device according to the present invention.
Figure 5:
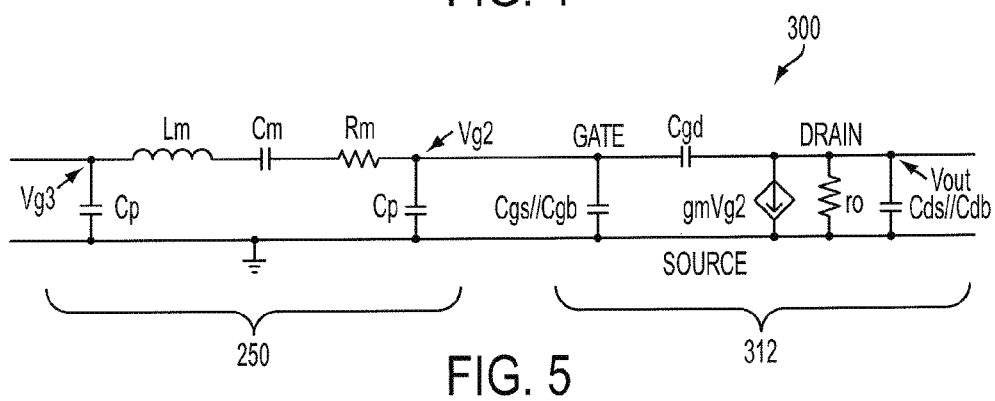
FIG. 5 is another schematic representation of the second embodiment NEMS/MEMS device.

Discussion of the equations begins with Equation (1), in which shows a useful approximation of the saturation current for JFETS like JFET 250. In Equation (1), $I_{DSS}$ is the maximum current when $V_{GS}$=0V and $V_P$ is the pinch-off voltage. Relying on the working principles of the n channel JFET, the motion of a NEMS cantilever was sensed using an integrated JFET. The schematic of the JFET-NEMS device is shown in FIG. 4 and its equivalent small signal model is illustrated in FIG. 5. More specifically, FIG. 4 shows NEMS/MEMS device 300, including: JFET 250; and NEMS/MEMS machine 312 (including moveable cantilever member 312a, first stationary member 312b and second stationary member 312c). JFET 250 includes a channel region which includes the following sub-regions: drain interface sub-region 302; first and second p doped sub-regions 306, 308; source interface sub-region 304; and lightly n doped sub-region 303, 305, 310 (including undepleted portion 310, and, when applicable, depleted zones 303, 305 that can change in their size and shape depending upon operating conditions).

As shown in FIG. 4, applying voltage $V_{G3}$ to the second stationary member, will cause the floating potential of Gate 2 (that is, the cantilever member) to adjust and take on value VG2. The floating potential of Gate 2 is used on an ongoing basis to modulate the channel conductance of the JFET. In this way, a motion characteristic (specifically position) of the moveable part (that is, the cantilever member) of the NEMS/MEMS machine is used to effectively detect the position of the cantilever by fluctuations in its floating potential. In device 300, this detection of the cantilever position is provided to the second p doped sub-region 308 of the channel region of JFET 250 in an extremely direct way because the cantilever member extends directly from, and is monolithically integrated with, the second p doped sub-region. In this way, changes in the cantilever member position in space will cause corresponding changes to channel conductance of JFET 250, and cantilever position helps control the operation of JFET 250 through this control of channel conductance.

As further shown in FIG. 4, the conducting channel (including both its depleted and undepleted portions) is lightly n-type doped. The gates interface sub-regions 306 and 308 are p+ doped and the source and drain interface sub-regions 302 and 304 are n+ doped. In this embodiment cantilever member 312a is 250 nm wide and is surrounded by stationary members 312b and 312c (sometimes respectively denominated herein as gate 3 and gate 4). As shown in FIG. 5, the bulk is the substrate of the SOI wafer. Additional mechanical components such as beam stoppers can be used to limit motion. These stopper enables the NEMS/MEMS machine to be configured into an electrical switch.

Figures 6A, 6B:
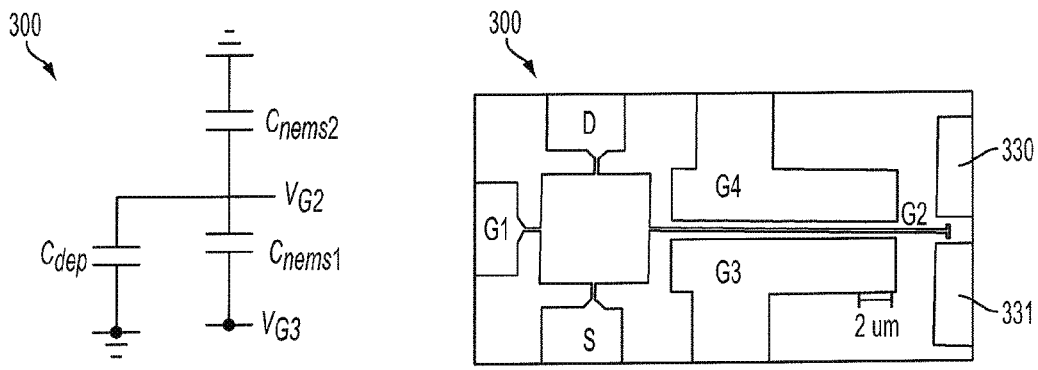
FIG. 6A is another schematic view of the second embodiment NEMS/MEMS device.
FIG. 6B is an orthographic plan view of the second embodiment NEMS/MEMS device.

When the gate-1-to-channel junction is reversed biased, its junction depletion width (that is, the size of depleted portion 303) increases. With further incremental changes in this reverse bias voltage, the channel could be "pinched-off" when the depleted zones extend across at least one transverse cross section of the conductance channel (that is, the lightly n doped sub-region). Gates 3 and 4 are used to actuate the cantilever, which, in turn, causes gate 2 (that is, the floating electrical potential of the cantilever) to help modulate channel conductance. FIGS. 6A and B respectively are: (i) the equivalent capacitive model; and a plan view of the JFET-NEMS device.

When a voltage is applied to gate 3, the cantilever moves closer to gate 3 due to electrostatic force of attraction. The electrostatic force between gate 3 and the cantilever is given by Equation (2), above. The force between the cantilever and gate 4 is given by Equation (3), above. In equation (3) $\in_0$ is the permittivity of vacuum, A=8e-8 cm$^2$ is the actuator area, d=350 nm is the initial gap, and x is the beam displacement. Using Taylor series approximation, Equation (4), as shown above, is obtained. In Equation (4), F3 is a parasitic force which is a negative spring and is known as spring softening. At equilibrium, the electrostatic force is equal to the spring force as in Equation (5), above. In Equation (5), m is the mass, g is the acceleration, k (=0.22 N/m) is the spring constant of the cantilever. From Equation (5), the displacement of the cantilever can be derived as Equation (6), above.

The equivalent capacitive model for the JFET-NEMS device is a simple capacitive divider as illustrated in FIG. 6A. From the capacitive model, the floating potential $V_{G2}$ of the cantilever is given by Equation (7), above. In Equation (7), $C_{nems1}$ and $C_{nems2}$ are derived as Equations (8) and (9), above. Equation (6) can be substituted into Equations (8) and (9). At the cantilever-JFET junction, the depletion capacitance is given by Equation (10), where $C_0$ is the nominal capacitance, q is the electron charge, $\in_{si}$ is the permittivity of silicon, $N_d$=4.16e14 ions/cm$^3$ is the doping concentration in the channel assuming a one-sided junction and $V_{bi}$=0.81 V is the built-in potential. $V_{G2}$ can be determined numerically by substituting Equations (8), (9) and (10) into Equation (7).

Figure 7A:
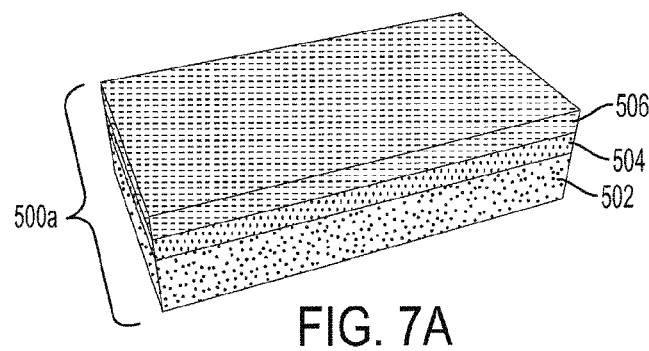
FIGS. 7A to 7O is a cross-sectional view that shows the layered structure of a third embodiment of a NEMS/MEMS device according to the present invention as it is being monolithically integrated and otherwise manufactured.
Figure 7B:
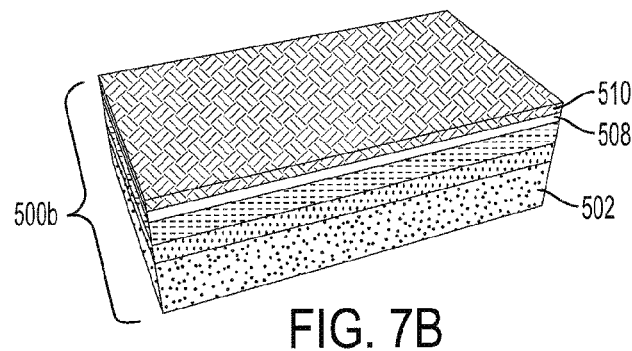
Figure 7C:
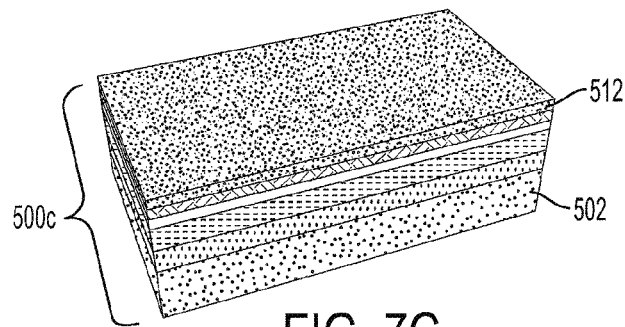
Figure 7D:
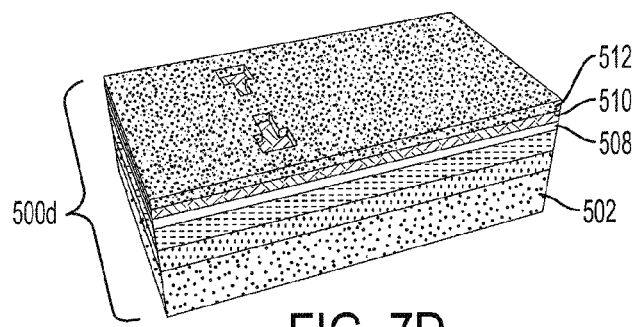
Figure 7E:
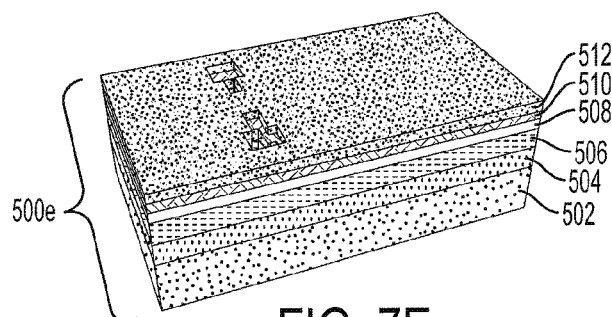
Figure 7F:
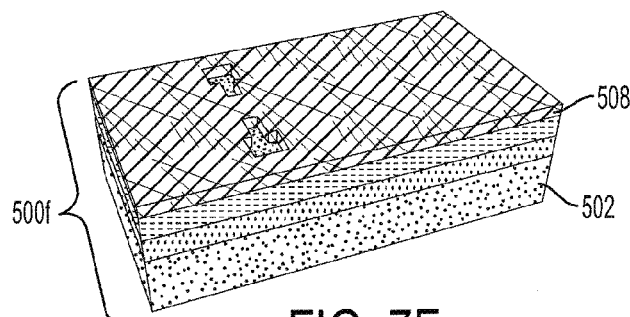
Figure 7G:
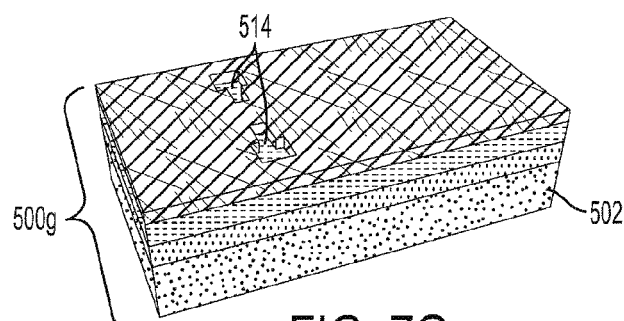
Figure 7H:
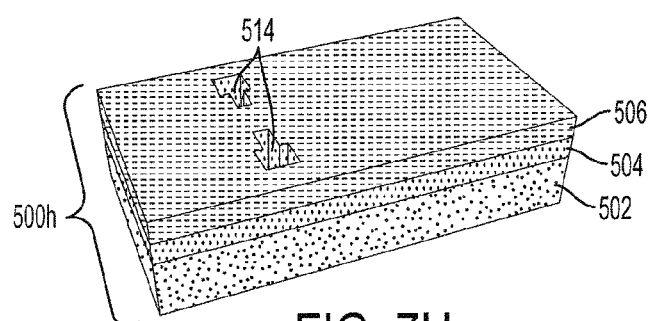
Figure 7I:
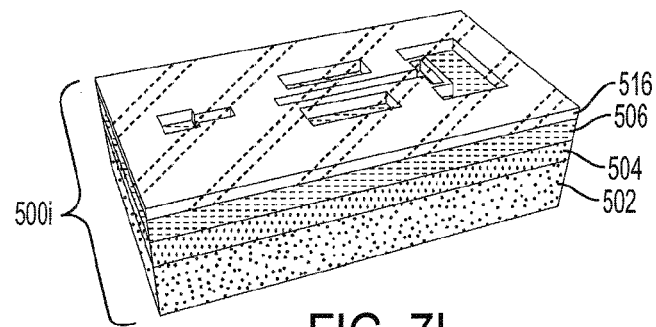
Figure 7J:
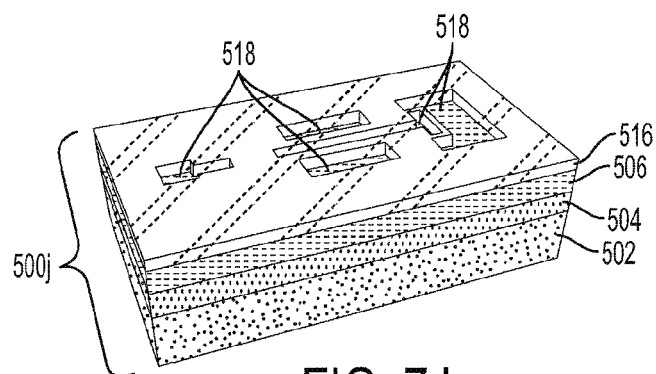
Figure 7K:
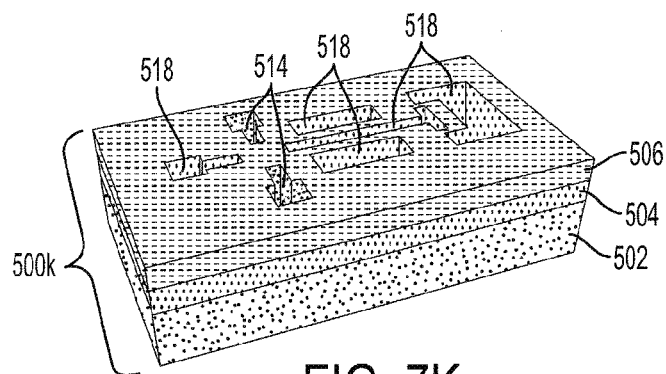
Figure 7L:
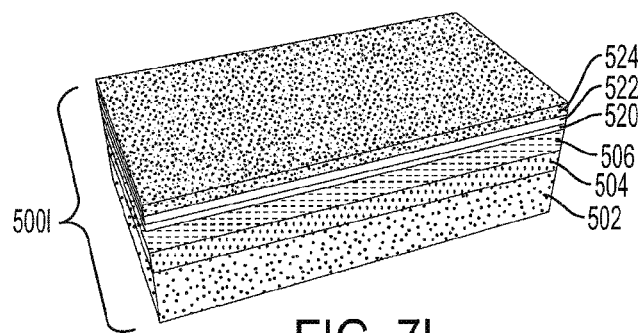
Figure 7M:
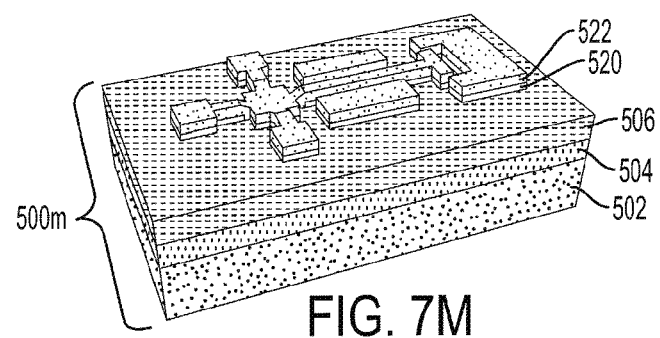
Figure 7N:
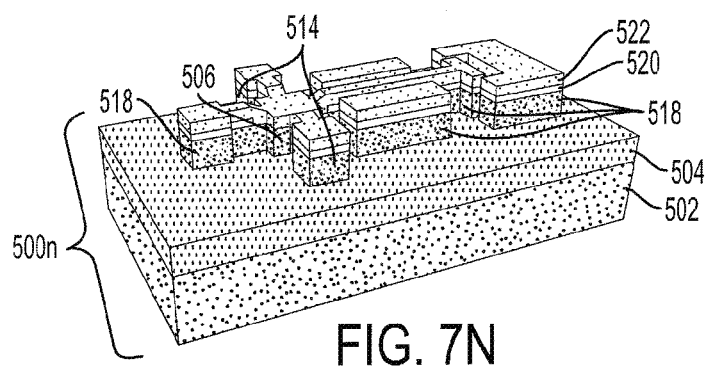
Figure 7O:
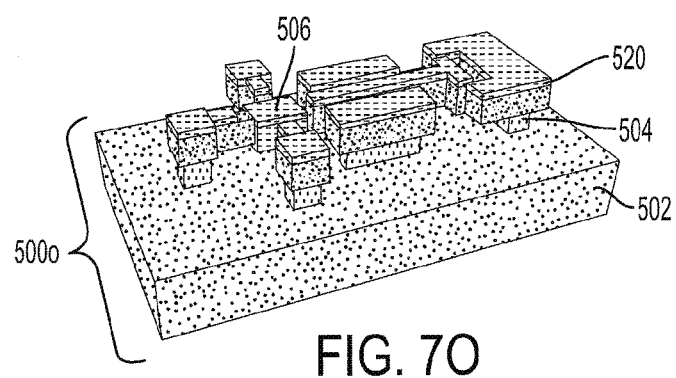

Device fabrication will now be discussed with reference to FIGS. 7A to 7O. As shown in FIGS. 7A to 7O, the process produces a series of stack-in-progress structures respectively given the reference numerals of 500a (that is, starting stock stack) to 500o (finished stack). The devices were realized in 2 μm-device layer n-type SOI wafer. One key feature of at least some "embodiments" of the fabrication process was that both the JFETs and the NEMS components appear on the same mask so the devices were processed simultaneously which eliminated the conventional post-processing of the NEMS components which is generally required in the context of NEMS/MEMS devices made using a CMOS chip. Stacks-in-progress 500a to 500o collectively include the following layers: first silicon layer 502; first silicon dioxide (or insulator) layer 504; second silicon layer 506; second silicon dioxide (or insulator) layer 508; first chromium layer 510; first resist layer 512; n doped portion 514; p doped portion 518; metal line layer 520; third silicon dioxide layer 522; second resist layer 524. The fabrication steps presented graphically in FIGS. 7A to 7O are as follows: (7A) SOI substrate provided; (7B) SiO$_2$ and Cr deposition; (7C) Polymethyl methacrylate ("PMMA") resist spinning; (D) Ebeam exposure of n+ region; (E) reactive-ion etching ("RIE") of Cr and SiO$_2$ etching; (F) wet etching of resist and Cr; (G) solid source diffusion of phosphorous dopant and annealing; (H) wet etching of SiO$_2$ diffusion mask; (I) repeat steps shown in FIGS. 7B to 7F; (J) solid source diffusion and annealing of boron; (K) wet etching of SiO2; (L) sputter on metal layer (preferably MoSi$_2$ or MoSi$_2$-containing), deposit SiO$_2$ and spin resist; (M) exposure of negative resist and RIE of SiO$_2$ and MoSi2; (N) Deep RIE (or "DRIE") of silicon device layer and; (O) BOE release of devices and critical point drying to prevent stiction.

The contact electrodes were silicidated with metal, preferably MoSi$_2$. MoSi$_2$, by its inherent material properties, has low resistance and exhibits low stress even as it moves with the moving part(s) of the NEMS/MEMS machine. This was done to ensure that there was ohmic contact between the Si and the probing pads. In the embodiment of FIG. 7, MoSi$_2$ (or other suitable metal) is sputtered and Rapid Thermal Annealed (RTA) at 750° C. in Ar gas for 3 minutes to form the ohmic contacts (including non-bonded conduction path(s) between each NEMS/MEMS machine and its associated JFET(s). The fabrication process involved 4 levels of electron beam lithography and 5 levels of photolithography. The mask count could be drastically reduced to 4 if deep ultraviolet ("DUV") lithography is used for the exposures of the NEMS components and the probing pads. We are currently using ASML DUV tool to make these devices.

Figure 8:
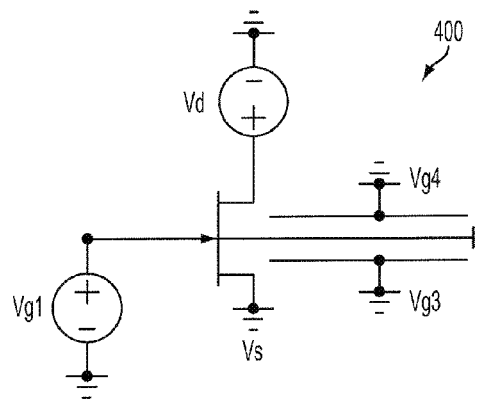
FIG. 8 is a schematic view of a fourth embodiment of a NEMS/MEMS device according to the present invention.
Figure 9:
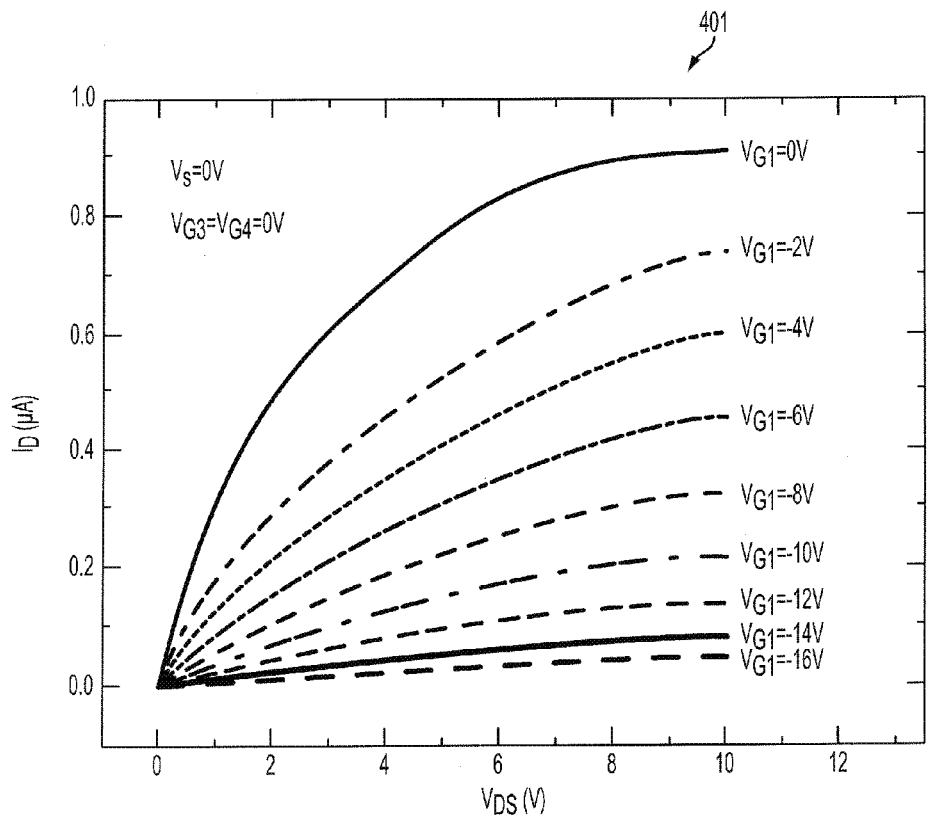
FIG. 9 is a graph showing certain characteristics of the performance of the fourth embodiment NEMS/MEMS device.
Figure 10:
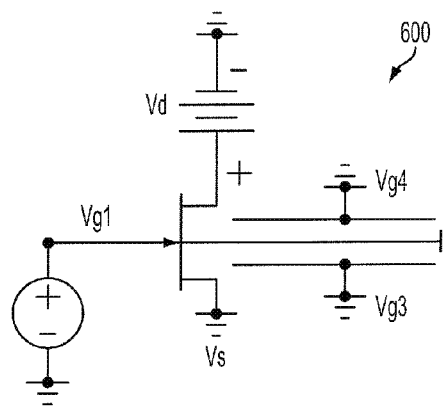
FIG. 10 is a schematic view of a fifth embodiment of a NEMS/MEMS device according to the present invention.
Figure 11:
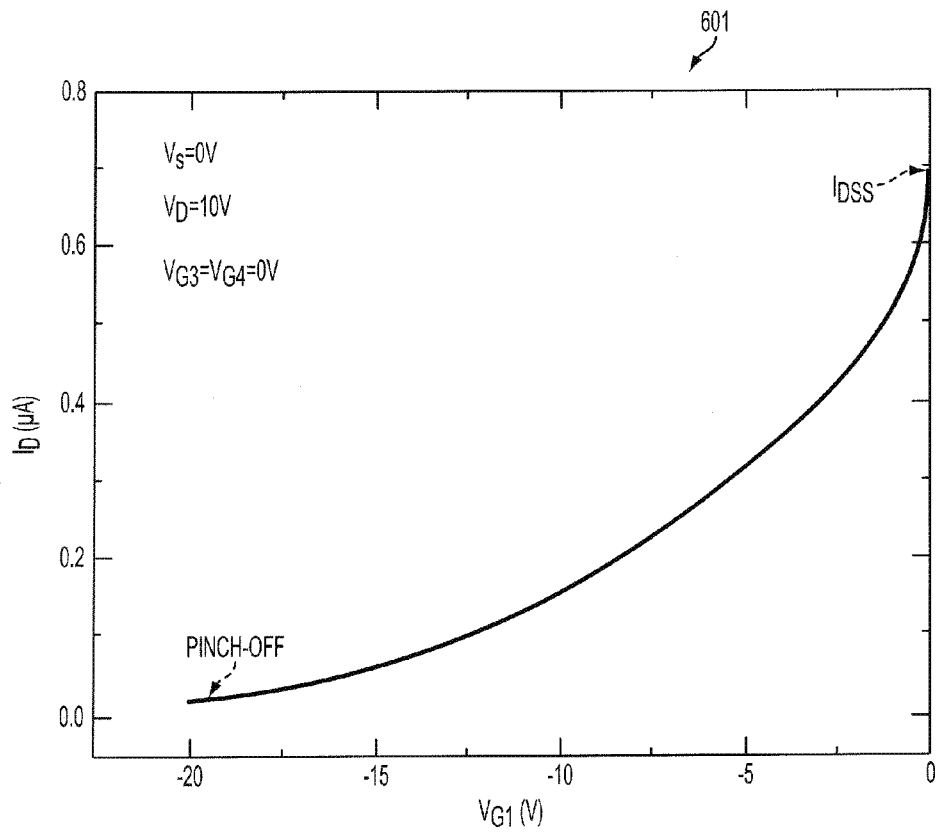
FIG. 11 is a graph showing certain characteristics of the performance of the fifth embodiment NEMS/MEMS device.

The current-versus-potential ("IV") characteristics of some JFETs, according to the present invention, will now be discussed. All IV measurements were carried out in vacuum (p~4 mbars). The measurements described here are for the device shown in FIG. 6B. FIG. 8 is a schematic 400 helpful in understanding graph 401 of FIG. 9. Graph 401 is the plot of $I_D$ versus $V_{DS}$ and it shows saturation as the channel is pinched-off. Graph 401 shows measured $I_{DS}$ versus $V_{DS}$ output curves for a JFET-NEMS device. The measured low current is due to the high drain and source resistances. FIG. 10 is a schematic 600 helpful in understanding graph 601 of FIG. 11. Graph 601 shows a curve corresponding to various $V_{G1}$ values, and further shows the expected pinch-off voltage Vp=−19V. $I_{DSS}$ was measured to be ~700 nA when $V_{GS}$=0V and $V_{Ds}$=10V. As shown in FIG. 11, this is a transfer curve for the JFET-NEMS device biased at $V_{DS}$=10V.

Figure 12:
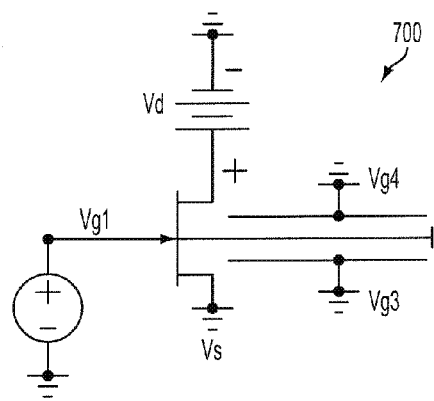
FIG. 12 is a schematic view, of a sixth embodiment of a NEMS/MEMS device according to the present invention.
Figure 13:
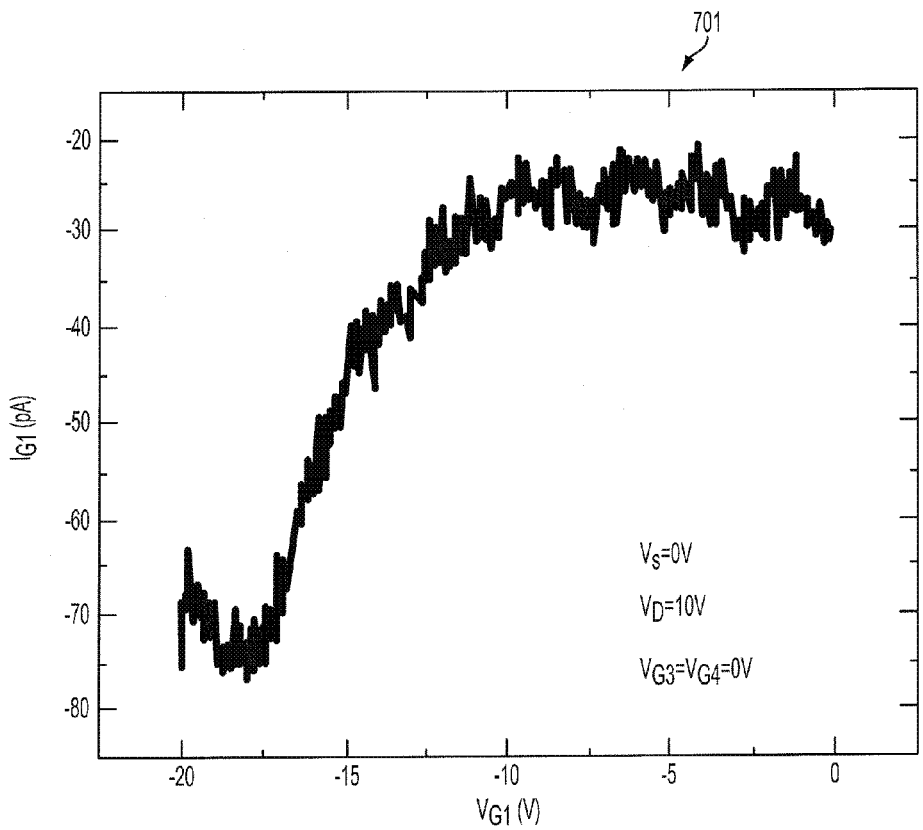
FIG. 13 is a graph showing certain characteristics of the performance of the sixth embodiment NEMS/MEMS device.

FIG. 12 shows a schematic helpful in understanding graph 701 of FIG. 13. Since the gate-channel is reverse biased, the gate leakage current should be minimal and it was measure to be ~70 pA at $V_{GS}$=−19V as illustrated in graph 701. Graph 701 shows that the gate leakage current when the JFET is turned off was ~70 pA.

Figure 14:
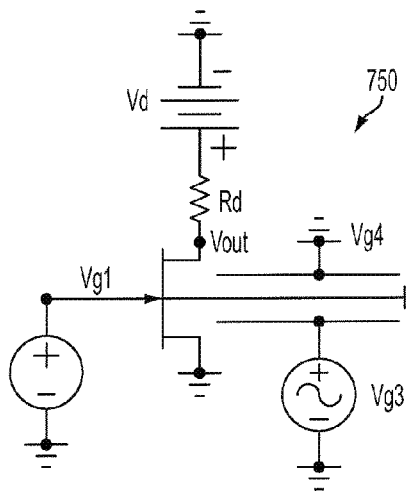
FIG. 14 is a schematic view of a seventh embodiment of a NEMS/MEMS device according to the present invention.
Figure 15:
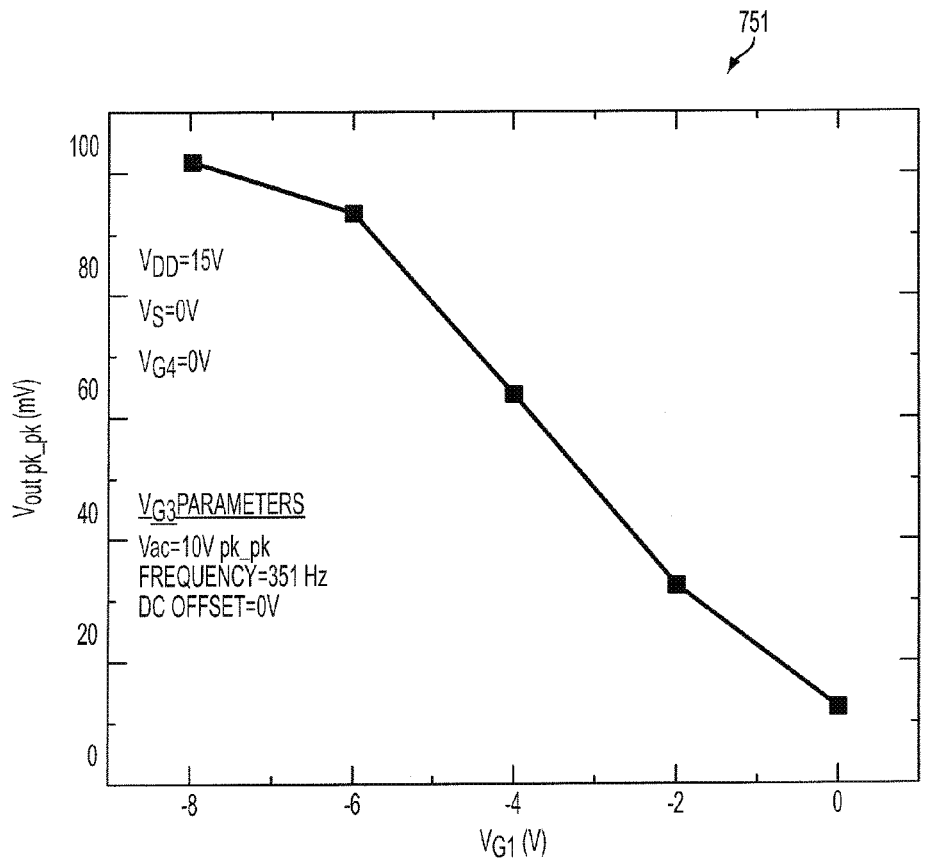
FIG. 15 is a graph showing certain characteristics of the performance of the seventh embodiment NEMS/MEMS device.
Figure 16:
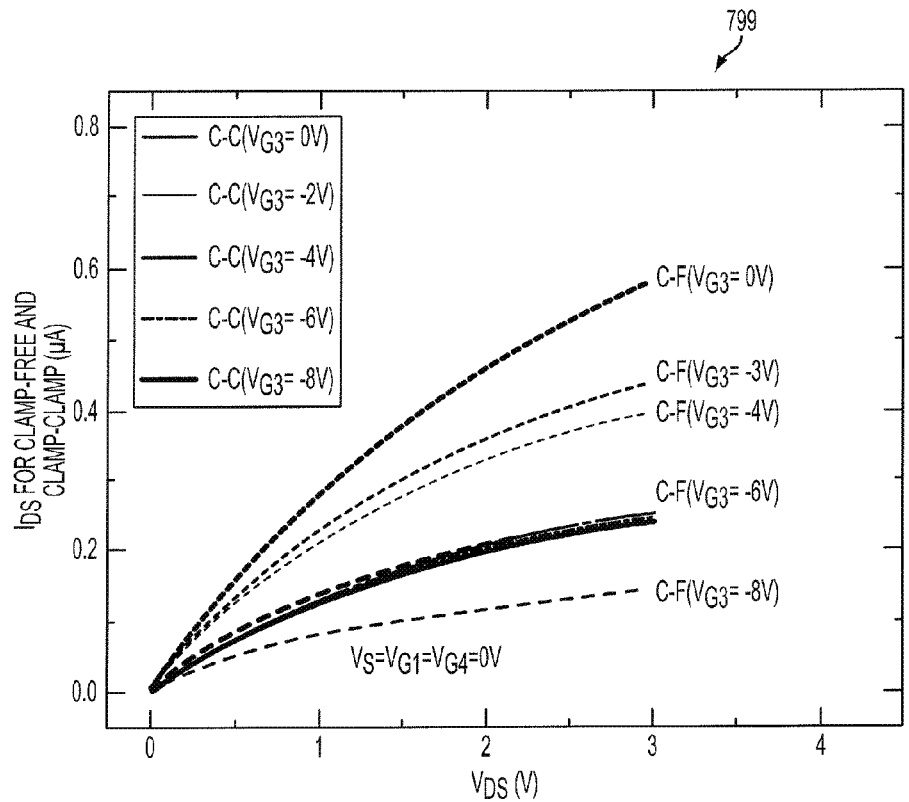
FIG. 16 is a graph showing certain characteristics of the performance of various embodiments of NEMS/MEMS devices according to the present invention.

A Common Source Amplifier Configuration of JFET-NEMS device will now be discussed. The JFET is then configured into a common source amplifier by connecting a 3 MΩ resistor at the drain. Such a large load resistor is justified due to the very large input resistance of the transistor channel. The transconductance (gm) of the transistor was 13.3 µS. This value is low due to a large parasitic resistance formed at the source and drain terminals. This large resistance leads to a very large RC time constant for charging and discharging the load capacitances, leading to a low frequency operation of 351 Hz. An AC signal is input at gate 3 and the drain output connected to an oscilloscope. The AC signal couples into the cantilever and this signal is transduced through the JFET portion. Changing the gate 1 voltage of the JFET changes the gain of the amplifier as shown in graph 751 of FIG. 15. FIG. 14 shows schematic 750, which is helpful for understanding graph 751. The capacitance from gate 3 to cantilever is 0.55 fF, and the capacitance from cantilever to gate of JFET is 0.53 fF. As shown in graph 751, the JFET-NEMS device is configured as a common source amplifier with $R_D$=3 MΩ. An AC signal is applied at gate 3 and the output voltage increases with increasing reverse bias on gate 1. The output AC signal is 180° phase shifted. Sensing the motion of the cantilever member through the JFET to sense the motion of the cantilever, the 3MΩ resistor is removed and the drain voltage is swept from 0-3V. The source, gate 1 and gate 4 voltages are placed at 0V. As the voltage on gate 3 is increased, the cantilever moves closer to the gate 3 electrode due to electrostatic force. The cantilever member has an electrical potential that floats in magnitude and/or direction as the body of the cantilever member moves through the electrical field created by the potential of the stationary members (see FIG. 4) that constitute gates 3 and 4. The phenomenon of capacitive coupling is what causes the cantilever member (that is, gate 2) to vary in voltage as it changes its position relative to stationary gates 3 and 4. This floating potential ($V_{G2}$) modulates the channel conductance. As the cantilever moves closer to gate 3, $C_{nems1}$ increases and it results in the increase of $V_{G2}$. Because $V_{G3}$ is negative, $V_{G2}$ is also negative according to Equation (7) and it reverse biases the cantilever-JFET junction. FIG. 16 shows graph 799, which is the plot of the response of the JFET to the motion of a clamp-free cantilever and a clamp-clamp cantilever. Since the clamp-free cantilever has a higher displacement with the same gate 3 voltage, its $V_{G2}$ is higher than the case of clamp-clamp beam and it is better able to modulate the drain channel conductance. As shown in FIG. 16, the JFET-NEMS device is able to sense the motion with the clamp-free and a clamp-clamp cantilever as gate 3 voltage is applied. The change in current is much larger for the clamped-free case.

The drain current modulation could be partly due to piezoresistive effect at the cantilever-channel junction that occurs as the beam bends. For illustrative purposes, some non-limiting device parameters of the JFET-NEMS device are as follows: Length of cantilever 20 µm; Width of cantilever 250 nm; Thickness 2 µm; Vpull-in 21V; Resonance Frequency 753 KHz; Gate 3,4 air gap 350 nm; JFET channel area 16 µm$^2$; Vp ($V_{DS}$=10V)−19V; $I_{DSS}$($V_{DS}$=10V) 0.69 µA; β (IDSS/Vp$^2$) 1.9 mA/V$^2$.

One feature of some embodiments of the present invention is monolithic integration of JFET with moving gates that can be NEMS or MEMS. The fabrication of the devices utilizes embedded JFET junctions at cross-points of SOI beams. Another feature of some embodiments of the present invention is that the JFET amplifier gain as well as its use in sensing a motion characteristic (e.g., position) of a moving part of a NEMS/MEMS machine. In various embodiments, the moving part(s) of the NEMS/MEMS machine may (without limitation) take various forms, such as a cantilever, an inertial sensor, a resonator, switch(es). In at least some embodiments of the present invention, tightly coupled NEMS/MEMS and electronics reduce parasitics and improve performance. Because SOI beams are common to many MEMS devices, JFETs can be used to sense and amplify motion for increased signal and reduce effect of parasitic capacitances encountered in two-chip MEMS and NEMS.

Figure 17A:
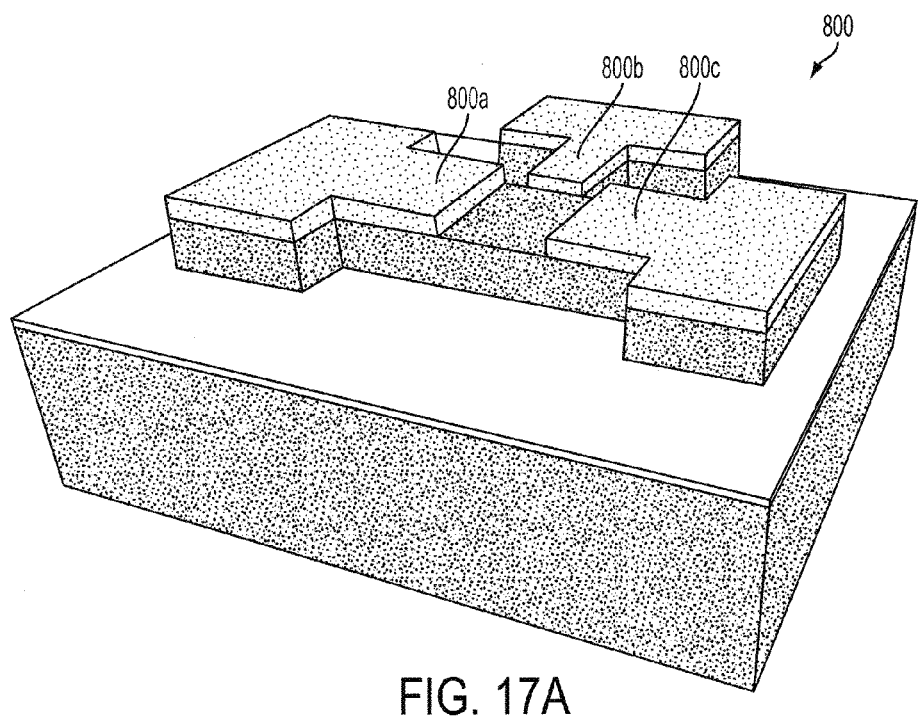
FIG. 17A is a perspective view of a circuit according to the present invention.
Figure 17B:
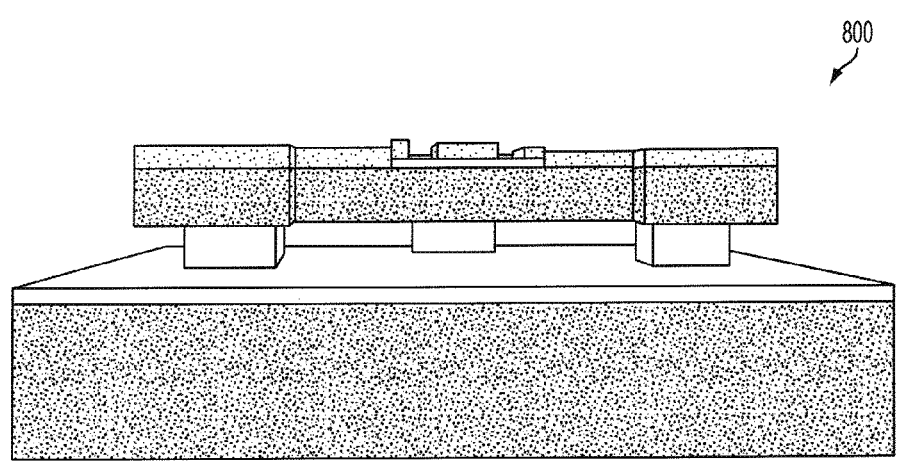
FIG. 17B is another perspective view of the FIG. 17A circuit.

Using JFET technology to fabricate BJTs, MESFETs and MOSFETs will now be discussed, starting with the BJT. Using the JFET fabrication technology, a Bipolar Junction Transistors (BJTs) can be realized by varying the doping concentration at the collector, base and emitter. There are two types of BJTs; the npn and the pnp. Three implantations or solid diffusion has to be carried out. The first diffusion at the emitter, the second at the base and the third at the collector terminals. The emitter and the collector are dosed with the same dopant (n or p) but the doping concentration at the emitter is higher than at the collector. DRIE is used to define the junctions. To improve isolation and reduce parasitics, the oxide below the device could be etched away and the device will be free standing. FIGS. 17A and 17B show schematic 800 of the proposed BJT. As shown in FIG. 17, Bipolar Junction Transistor (BJT) with emitter, base and collector terminals. The emitter is highly doped than the collector. Both NPN and PNP transistors can be fabricated using this technology. (B) The cross section of a released device. The conducting channel for all these devices can be released by etching away the buried oxide. Releasing the conducting layer provides isolation and reduces parasitics between the channel and the substrate.

Figure 18:
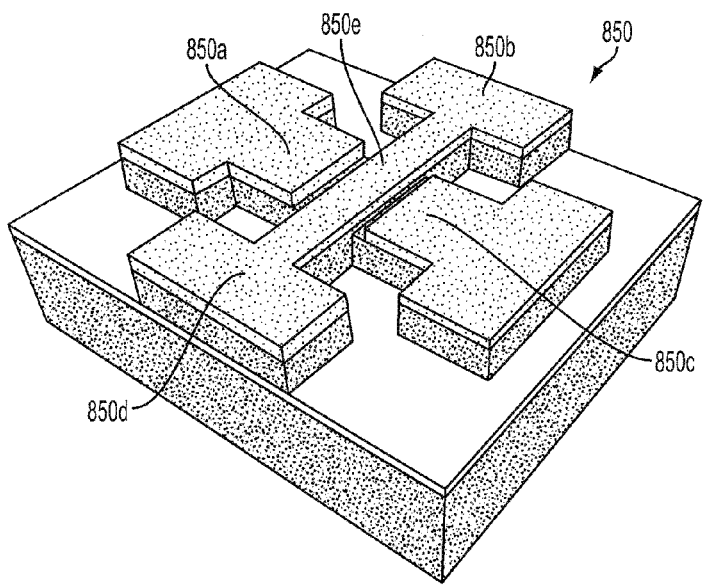
FIG. 18 is a perspective view of another circuit according to the present invention.

The operation of the Metal Semiconductor Field Effect Transistor (MESFET) is similar to the JFET where the channel is pinched-off by applying a reverse bias voltage to the gate. The device is unipolar and majority carrier conducts the current through the channel. The major difference between the MESFET and the JFET is that the gate of the MESFET is Schottky contact whereas it is ohmic for the JFET. Schottky gate contacts are used in order to decrease the reverse gate leakage current during the operation of the device. To implement a Schottky contact in the current JFET technology, a metal with high work function such as Platinum should be deposited on an n-type gate and a metal with low work function such as Molybdenum should be deposited on the p-type gate. These metals are compatible with the current JFET technology. FIG. 18 illustrates the schematic of a MESFET.

The gate depletes the channel starting from the top (the interface between the gate and Si channel) to the bottom (the area lying on top of the SiO$_2$). These devices could be freely released as well. FIG. 18 shows: Metal Semiconductor Field Effect Transistor (MESFET) 850. The gate is a Schottky contact but the source and drain are ohmic contacts.

Figure 27:
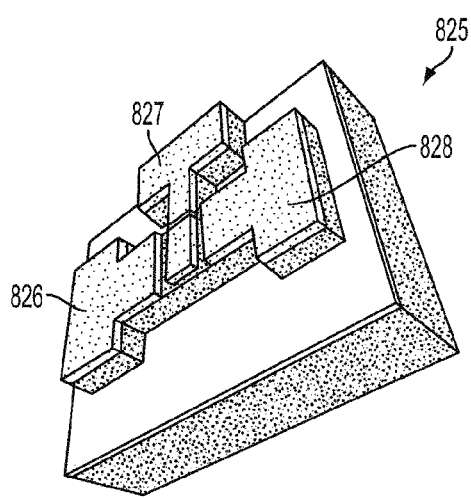
FIG. 27 is a perspective view of a device 825 according to the present invention, the device including source 826, gate 827 and drain 828.

The Metal Oxide Field Effect Transistor (MOSFET) is a minority carrier device where a gate voltage is applied to deplete and invert the channel which lies below the gate dielectric. To integrate MOSFETs into the JFET technology, the major additional fabrication step is the deposition of a few nanometers (<10 nm) of dielectric material such as SiO$_2$ between the channel and gate metal. FIG. 27 shows the schematic of the proposed MOSFET device 825. The drain, source and gate are ohmic contacts and a dielectric layer is sandwiched between the gate and the channel. FIG. 27: Metal Oxide Semiconductor Field Effect Transistor (MOSFET). An insulating layer (SiO$_2$) lies between the gate electrode and the conducting channel.

Figure 19:
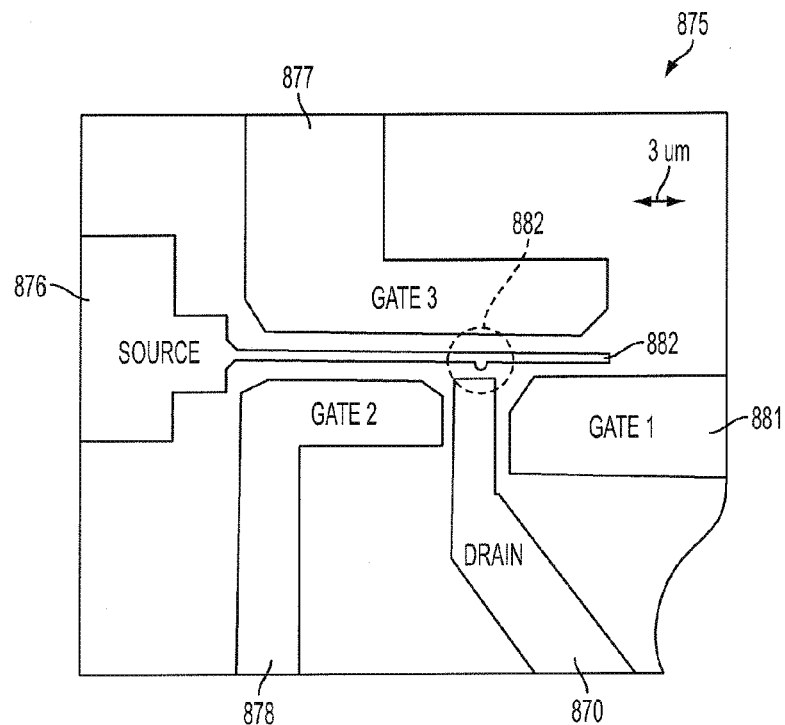
FIG. 19 is a plan view of an eighth embodiment of a NEMS/MEMS device according to the present invention.
Figure 20:
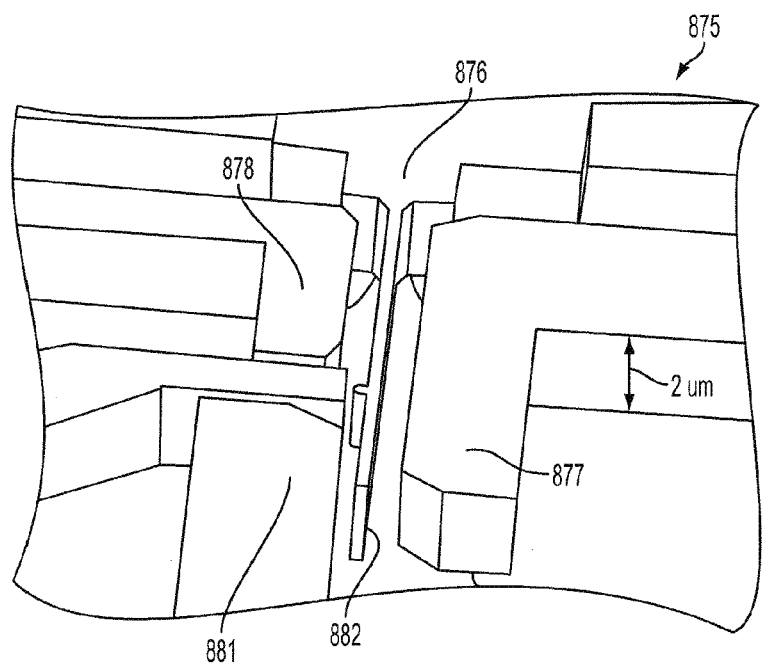
FIG. 20 is a perspective view of the eighth embodiment device.
Figure 22:
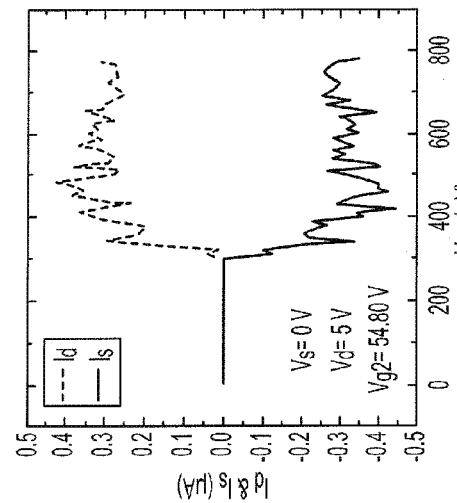
FIG. 22 is a graph showing certain characteristics of the performance of a NEMS/MEMS device according to the present invention.
Figure 21:
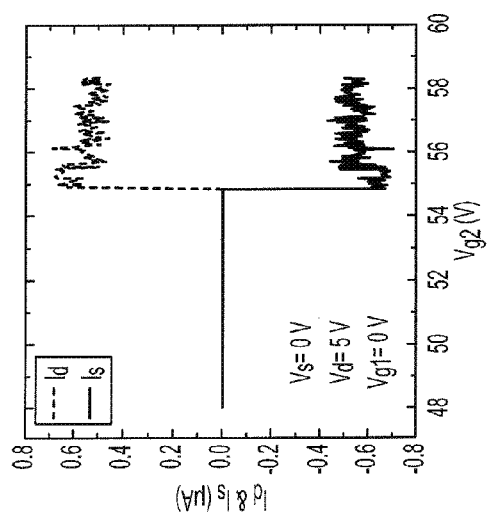
FIG. 21 is a graph showing certain characteristics of the performance of a NEMS/MEMS device according to the present invention.

FIGS. 19 and 20 show a NEMS/MEMS machine 875, suitable for us in NEMS/MEMS devices according to the present invention), device 875 including: source 876; third gate 877; cantilever switch member 882 (including protrusion 882a); first gate 881; drain 879; and second gate 878. The graphs shown in FIGS. 21 and 22 show performance characteristics of device 875.

Figure 23:
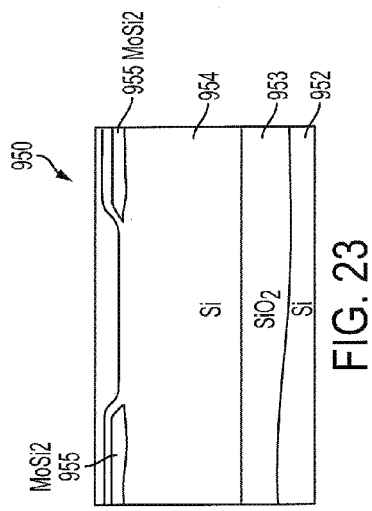
FIG. 23 shows a transverse cross-section of a three layer SOI stack suitable for use in various embodiments of the present invention.

FIG. 23 shows a stack structure for making JFETs according to the present invention, stack 950 including: first semiconductor layer 952; insulator layer 953; second semiconductor layer 954; and metal layer 955. One feature of some embodiments of the present invention is that the doping of the various portions of the JFET run through the entire thickness of a stack structure, all the way down to an insulative layer laminated at the bottom of the semiconductor layer that houses the JFET. In this example, the semiconductor layer being second semiconductor layer 954. More specifically, it prevents the conducting channel from extending in the transverse direction beyond the major surfaces of the semiconductor layer. In fact, this type of JFET with a stacked layer structure, with its source, drain, gate(s) and conducting channel being present in a relatively thin layer of selectively doped semiconductor, sandwiched between insulative layers (and/or metal contact lines) may be novel as a JFET architecture, in and of itself.

Figure 24:
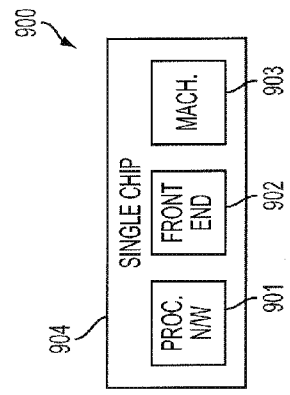
FIG. 24 shows a first alternative NEMS/MEMS system level architecture (including certain control electronics, other than the JFET sensor/amplifiers, which will herein be sometimes referred to as CMOS control electronics)
Figure 25:
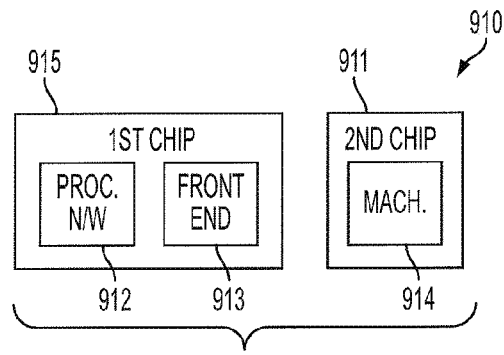
FIG. 25 shows a second alternative of CMOS and NEMS/MEMS system level architecture (including certain control electronics, other than the JFET sensor/amplifiers, which will herein be sometimes referred to as CMOS control electronics)
Figure 26:
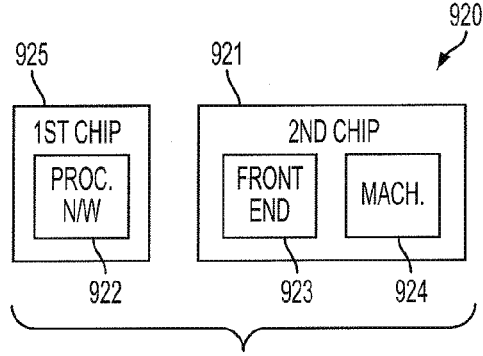
FIG. 26 shows a third alternative of CMOS and NEMS/MEMS system level architecture (including certain control electronics, other than the JFET sensor/amplifiers, which will herein be sometimes referred to as CMOS control electronics)

FIGS. 24, 25 and 26 respectively show three possible system level architectures 900, 910, 920 for NEMS/MEMS devices according to the present invention. In architecture 900, processing network 901; front end 902 (including JFETs); and NEMS/MEMS machine 903 are all present on a single chip 904. In architecture 910, processing network 912 and front end 913 (including JFETs) are on a first chip 915, and NEMS/MEMS machine 914 is on a second chip 911. In architecture 920: first chip 925 includes processing network 922 and second chip 921 includes front end 923 and machine 924. Various embodiments of the present invention may conform to any of these different architectures 900, 910, 920. Currently, for at least some applications, architecture 920 is preferred, but this preference is subject to change.

Some potential applications of the inventive JFETs and/or NEMS/MEMS devices according to the present invention are (without limitation): inertia sensors, accelerometers, gyroscopes, use in tip based manufacturing (especially in providing moveable probes); and probe moving (for tip based manufacturing probes and/or other types of precision-position probes). Also additional applications will be in inertial sensors such accelerometers, gyroscopes, and switches.

Figure 28:
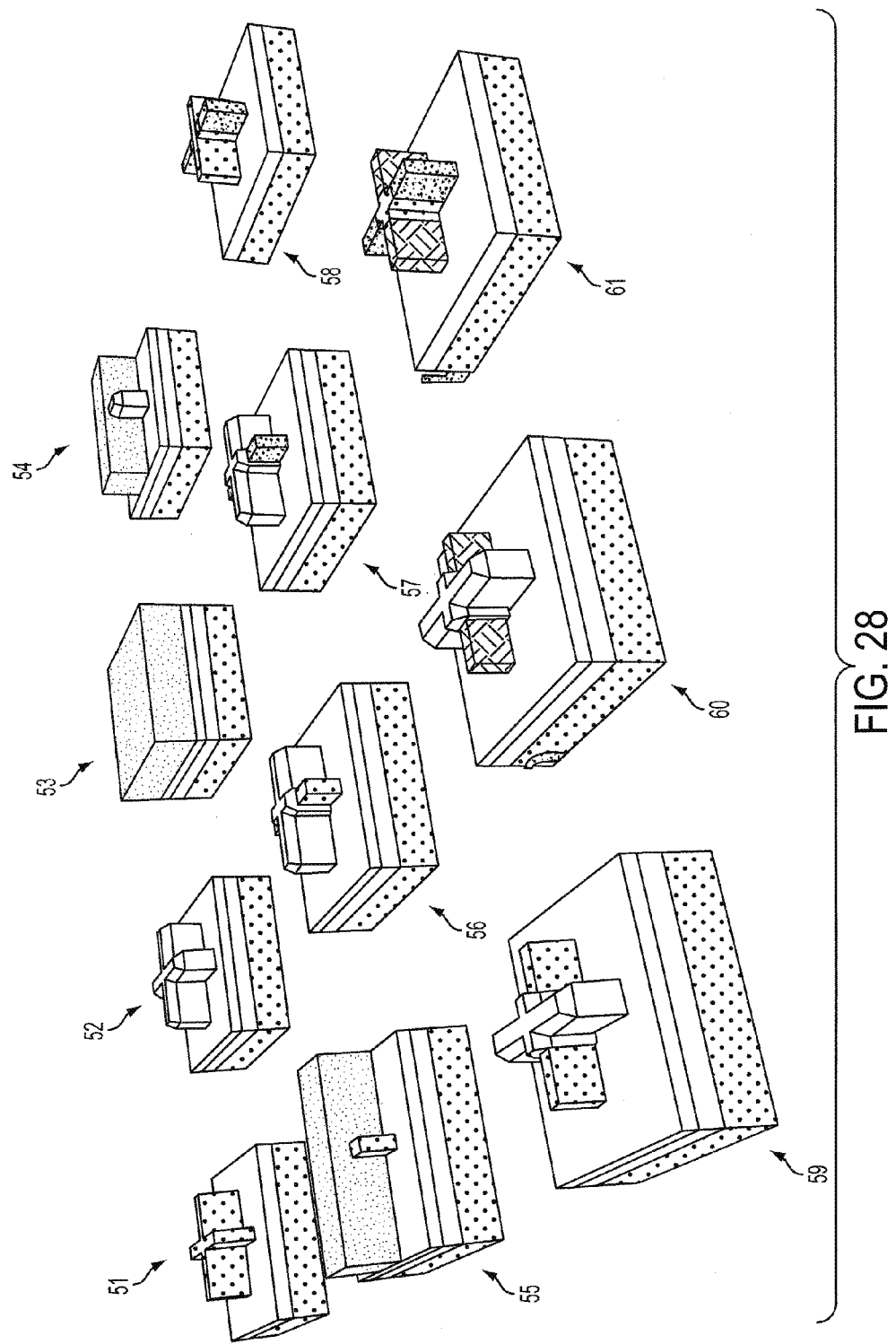
FIG. 28 is a method of fabricating with nine intermediate stack structures that exist during the manufacturing process.

FIG. 28, at reference numerals 1-9 corresponding to intermediate stack structures of the process, shows a fabrication process according to the present invention:

Etch the cross bar in the device layer of SOI using conventional micromaching process.

Deposit conformal SiO2 using Plasma Enhanced Chemical Vapor Deposition (PECVD) or Atomic Layer Deposition (ALD)

Spin photoresist (ideally conformal by using a low spin speed)

Expose region of the source and drain

Wet etch conformal oxide that covers source and drain region

Remove photoresist

Diffuse n dopant (ideally phosphorus) into the source and drain regions. The dopant will diffuse ONLY into the channel. Also anneal to drive dopants further in.

Remove conformal SiO2

Repeat steps 2 to 6 then diffuse p dopant into the gates region. Anneal and wet etch conformal SiO2.

Further photolithographic steps can be carried out to create MoSi2 metalization for the device.

FIG. 29, at reference numerals 1-1 corresponding to intermediate stack structures of the process, shows a fabrication process according to the present invention: see the text on FIG. 29 for a recitation of the steps of the FIG. 29 fabrication process.

DEFINITIONS

Any and all published documents mentioned herein shall be considered to be incorporated by reference, in their respective entireties. The following definitions are provided for claim construction purposes:

Present invention: means "at least some embodiments of the present invention," and the use of the term "present invention" in connection with some feature described herein shall not mean that all claimed embodiments (see DEFINITIONS section) include the referenced feature(s).

Embodiment: a machine, manufacture, system, method, process and/or composition that may (not must) be within the scope of a present or future patent claim of this patent document; often, an "embodiment" will be within the scope of at least some of the originally filed claims and will also end up being within the scope of at least some of the claims as issued (after the claims have been developed through the process of patent prosecution), but this is not necessarily always the case; for example, an "embodiment" might be covered by neither the originally filed claims, nor the claims as issued, despite the description of the "embodiment" as an "embodiment."

First, second, third, etc. ("ordinals"): Unless otherwise noted, ordinals only serve to distinguish or identify (e.g., various members of a group); the mere use of ordinals shall not be taken to necessarily imply order (for example, time order, space order).

Electrically Connected: means either directly electrically connected, or indirectly electrically connected, such that intervening elements are present; in an indirect electrical connection, the intervening elements may include inductors and/or transformers; for example, a conduction path that includes a mechanically pliant capacitive coupling shall herein be considered to form an "electrical connection" as that term is defined by this definition (and such a path might even be a "non-bonded path" (see DEFINITIONS section), notwithstanding the presence of the capacitive coupling).

Mechanically connected: Includes both direct mechanical connections, and indirect mechanical connections made through intermediate components; includes rigid mechanical connections as well as mechanical connection that allows for relative motion between the mechanically connected components; includes, but is not limited to, welded connections, solder connections, connections by fasteners (for example, nails, bolts, screws, nuts, hook-and-loop fasteners, knots, rivets, quick-release connections, latches and/or magnetic connections), force fit connections, friction fit connections, connections secured by engagement caused by gravitational forces, pivoting or rotatable connections, and/or slidable mechanical connections.

Module/Sub-Module: any set of hardware, firmware and/or software that operatively works to do some kind of function, without regard to whether the module is: (i) in a single local proximity; (ii) distributed over a wide area; (ii) in a single proximity within a larger piece of software code; (iii) located within a single piece of software code; (iv) located in a single storage device, memory or medium; (v) mechanically connected; (vi) electrically connected; and/or (vii) connected in data communication.

NEMS/MEMS scale: on the scale of nanoelectromechanical systems or microelectromechanical systems.

NEMS/MEMS machine: a NEMS/MEMS scale hardware set having at least one moving part.

conductor bonding: includes, but is not limited to, flip chip conductor path type bonding; wire bonding; lead bonding; any conductor bonding that may be associated with vias, etc.

non-bonded path: any conduction path that is at least substantially clear of conductor bonding.

motion characteristic: includes, but is not necessarily limited to characteristics such as position, velocity, acceleration, or rotation.

JFET: junction gate field-effect transistor
SOI: Silicon-on-insulator.

Differential mode sensing: can be of two types. Sensors are usually sensitive to many things including the variable wanted to sense; in the first kind of differential sensing, the two sensors are used such that both are exposed to the general environment, but only one responds to the preferred sensor signal; by subtracting the two signals measurement of the variable needed is obtained; the second differential mode is in which the two sensors respond to the variable in question with 180 degrees of polarity difference; in this case two signals are added to extract the desired value.

Unless otherwise explicitly provided in the claim language, steps in method or process claims need only be performed that they happen to be set forth in the claim only to the extent that impossibility or extreme feasibility problems dictate that the recited step order be used. This broad interpretation with respect to step order is to be used regardless of alternative time ordering (that is, time ordering of the claimed steps that is different than the order of recitation in the claim) is particularly mentioned or discussed in this document. Any step order discussed in the above specification, and/or based upon order of step recitation in a claim, shall be considered as required by a method claim only if: (i) the step order is explicitly set forth in the words of the method claim itself; and/or (ii) it would be substantially impossible to perform the method in a different order. Unless otherwise specified in the method claims themselves, steps may be performed simultaneously or in any sort of temporally overlapping manner. Also, when any sort of time ordering is explicitly set forth in a method claim, the time ordering claim language shall not be taken as an implicit limitation on whether claimed steps are immediately consecutive in time, or as an implicit limitation against intervening steps.

What is claimed is:

1. A device comprising:
    a first insulator layer that defines: (i) the major plane of the device; and (ii) a transverse direction that is normal to the major plane at any given point on the major plane; and
    a first semiconductor layer;
wherein:
    the first semiconductor layer and the first insulator layer are monolithically integrated into a stack structure;
    the stack structure includes a first NEMS/MEMS region;
    the first NEMS/MEMS region of the stack structure is structured, connected, sized, shaped and/or located to operate as a first NEMS/MEMS machine that includes a first moving part;
    the semiconductor layer includes a first major surface and a second major surface, spaced apart in the transverse direction;
    the first semiconductor layer includes a first JFET structure;
    the first JFET structure includes: the following JFET regions: a source region, a drain region, a first gate region and a conductance channel region;
    the following JFET regions of the first JFET extend entirely across a transverse dimension of the first semiconductor layer;
    x is a first doping type (either p or n);
    y is a second doping type (either p or n);
    the conductance channel region of the first JFET structure is x doped and the first gate is y doped, to an extent so that during operation of the device: (i) the conductance channel of the first JFET structure will develop depleted and undepleted portions, and (ii) the depleted portions will, at times and as determined by operating conditions, pinch off the conductance channel of the first JFET structure;
    the first JFET is electrically connected to the first NEMS/MEMS machine;
    the first insulator layer is electrically insulating so that current does not flow in the first insulator layer during operation of the device.

2. The device of claim 1 wherein:
    the first semiconductor layer further includes: a y doped second gate region;
    the first gate region is sized, shaped and/or located to oppose the second gate region; and
    the conductance channel is located between the first gate region and the second gate region.

3. The device of claim 2 wherein y is p type doping and x is n type doping.

4. The device of claim 2 wherein y is n type doping and x is p type doping.

5. The device of claim 1 wherein y is p type doping and x is n type doping.

6. The device of claim 2 further comprising an amplifier where the first JFET makes up at least a portion of the amplifier.

7. The device of claim 6 wherein the first moving part comprises a cantilever member.

8. The device of claim 7 wherein the floating potential portion is located in the cantilever member.

9. The device of claim 7 wherein the floating potential portion is located in the first NEMS/MEMS machine, but outside of the first moving part.

10. A device of claim 1 wherein:
the stack structure further includes a second NEMS/MEMS region;
the second NEMS/MEMS region of the stack structure is structured, connected, sized, shaped and/or located to operate as a second NEMS/MEMS machine that includes a first moving part;
the first semiconductor layer includes a second JFET structure each of the regions of which extends across the entire transverse direction of the first semiconductor layer from the major surface of the first semiconductor layer adjacent the first insulator layer to the opposite major surface of the first semiconductor layer;
the second JFET structure includes: a source region, a drain region, a first gate region and a conductance channel region;
the conductance channel region of the second JFET structure is n doped and the first gate is p doped, to an extent so that during operation of the device: (i) the conductance channel of the second JFET structure will develop depleted and undepleted portions, and (ii) the depleted portions will, at times and as determined by operating conditions, pinch off the conductance channel of the second JFET structure; and
the second JFET is electrically connected to the second NEMS/MEMS machine.

11. The device of claim 1 wherein:
the first insulator layer is made of silicon dioxide; and
the first semiconductor layer is made of silicon.

12. The device of claim 11 further comprising a second semiconductor layer, wherein the first semiconductor layer, the second semiconductor layer and the first insulator layer are all monolithically integrated into the stack structure so that the insulator layer is disposed between the first semiconductor layer and the second semiconductor layer.

13. The device of claim 7 further including a first metal layer, wherein: the first semiconductor layer is disposed between the first metal layer and the first insulator layer.

14. The device of claim 7 wherein:
the first metal layer comprises a movable portion;
the movable portion of the first metal layer is attached in a laminate stack relationship with the first moving part of the first NEMS/MEMS machine.

15. The device of claim 14 wherein the first metal layer is at least partially comprised of a metal silicide.

16. The device of claim 14 wherein the first metal layer is at least partially comprised of $MoSi_2$.

17. A method of making a JFET structure, the JFET structure comprising a first insulator layer and a first semiconductor layer, the method comprising the steps of:
monolithically forming the first semiconductor layer and the first insulator layer into a stack structure so that the first semiconductor layer includes the JFET structure such that the JFET structure is electrically isolated from other layers of the stack structure that also monolithically includes a NEMS/MEMS structure;
x doping the first semiconductor layer, across its entire transverse direction, to form in the first semiconductor layer a source region;
x doping the first semiconductor layer, across its entire transverse direction, to form in the first semiconductor layer a drain region;
lightly x doping the first semiconductor layer, across its entire transverse direction, to form in the first semiconductor layer a conductance channel; and
y doping the first semiconductor layer, across its entire transverse direction, to form in the first semiconductor layer a first gate region;
wherein:
x is a first doping type (either p or n);
y is a second doping type (either p or n);
the doping steps create the JFET structure within the first semiconductor layer;
the JFET structure is structured, located and/or connected so that during operation of the JFET structure: (i) the conductance channel of the first JFET structure will develop depleted and undepleted portions, and (ii) the depleted portions will, at times and as determined by operating conditions, expand to pinch off the conductance channel.

18. The method of claim 17 further comprising the following step:
y doping the first semiconductor layer, across its entire transverse direction, to form in the first semiconductor layer a second gate region so that: (i) the second gate region opposes the first gate portion, and (ii) the conductance channel is located between the first gate portion and the second gate portion.

19. The method of claim 17 where x is n and y is p.

20. The method of claim 17 wherein the doping steps are performed by solid state diffusion.

21. An electromechanical structure comprising a JFET structure located over a substrate and monolithically integrated with a NEMS/MEMS structure located over the substrate, wherein at least one of a source region, a drain region, a channel region and a gate region that comprises the JFET structure is formed transversely completely through a semiconductor layer that comprises the electromechanical structure.

22. The electromechanical structure of claim 21 wherein:
the source region, the drain region, the gate region and the channel region within the JFET structure are coplanar at a first spacing over the substrate; and
an actuator and an actuatable moving part within the NEMS/MEMS structure are coplanar at a second spacing over the substrate.

23. The electromechanical structure of claim 22 wherein the first spacing and the second spacing are equal.

24. A method for fabricating an electromechanical structure comprising:
forming over a substrate at least one semiconductor layer that is spaced from and electrically isolated with respect to a substrate;
patterning the at least one semiconductor layer to provide a JFET structure located over the substrate and monolithically integrated with a NEMS/MEMS structure located over the substrate.

25. The method of claim 24 wherein:
a source, a drain, a gate and a channel within the JFET structure are coplanar at a first spacing over the substrate; and
an actuator and an actuatable moving part within the NEMS/MEMS structure are coplanar at a second spacing over the substrate.

26. The electromechanical structure of claim 25 wherein the first spacing and the second spacing are equal.

* * * * *

UNITED STATES PATENT AND TRADEMARK OFFICE
CERTIFICATE OF CORRECTION

| | | |
|---|---|---|
| PATENT NO. | : 9,159,710 B2 | Page 1 of 1 |
| APPLICATION NO. | : 13/990830 | |
| DATED | : October 13, 2015 | |
| INVENTOR(S) | : Amit Lal et al. | |

It is certified that error appears in the above-identified patent and that said Letters Patent is hereby corrected as shown below:

Specification
Column 1, lines 16-17, under the FEDERALLY SPONSORED RESEARCH OR DEVELOPMENT heading, delete "The U.S. Government may have certain rights in this invention pursuant to Grant No. DMR 0520404 awarded by NSF." and insert --This invention was made with government support under DMR 0520404 awarded by NSF. The government has certain rights in the invention.--

Signed and Sealed this
Fifth Day of April, 2016

Michelle K. Lee
*Director of the United States Patent and Trademark Office*